US005781016A

United States Patent [19]

Maeda

[11] Patent Number: 5,781,016

[45] Date of Patent: Jul. 14, 1998

[54] CONNECTOR FITTING DETECTION APPARATUS

[75] Inventor: Akira Maeda, Shizuoka-ken, Japan

[73] Assignee: Yazaki Corporation, Tokyo, Japan

[21] Appl. No.: 814,937

[22] Filed: Mar. 12, 1997

[30] Foreign Application Priority Data

Mar. 15, 1996 [JP] Japan .................................... 8-059282

[51] Int. Cl.[6] .............................. G01R 31/04; H01R 3/00

[52] U.S. Cl. .......................... 324/538; 324/761; 324/756; 439/489; 439/188

[58] Field of Search .................................... 324/537, 538, 324/756, 761, 762; 439/488, 489, 188, 350, 347, 370

[56] References Cited

U.S. PATENT DOCUMENTS

| | | | |
|---|---|---|---|
| 5,174,776 | 12/1992 | Ohtaka et al. | 439/488 |
| 5,618,201 | 4/1997 | Yagi et al. | 439/489 |
| 5,620,346 | 4/1997 | Okumura | 439/488 |
| 5,629,627 | 5/1997 | Hoshino et al. | 324/538 |
| 5,670,884 | 9/1997 | Kodama | 324/538 |
| 5,672,073 | 9/1997 | Matsumura et al. | 439/489 |

FOREIGN PATENT DOCUMENTS 6-310209 11/1994 Japan .

*Primary Examiner*—Diep N. Do

*Attorney, Agent, or Firm*—Finnegan, Henderson, Farabow, Garrett & Dunner, L.L.P.

[57] ABSTRACT

One of two connector housings adapted to be fitted with each other has a slider with a cam section. The second connector housing is formed with a slider pressure protrusion. When the connector housings are fitted with each other, the slider is moved against the force of a spring as the slider pressure protrusion applies a sliding pressure to the cam section. The slider is in the original position thereof when the connectors are not fitted, comes away from the original position in the process of the connector housings being fitted with each other, and returns to the original position upon complete fitting of the connector housings. The first connector housing and the slider each include a fitting detection terminal adapted to fit each other when the slider is in the original position and come out of contact from each other when the slider leaves the original position. As a result, dust and dirt are prevented from attaching on the mutual contact surfaces of the fitting detection terminals for an improved reliability of fitting detection.

9 Claims, 31 Drawing Sheets

PTIOR ART 520
530
540
350
31a
31b
32a
32b
33
34
35
41
42
43
43a
44
49
51
52
53
60
60a
61
61a
65
66
68
81
82
83
84
84a
84b

CONNECTOR FITTING DETECTION APPARATUS

BACKGROUND OF THE INVENTION

The present invention relates to a connector fitting detection apparatus for detecting whether a connector used for connecting the automotive wire harness has been normally coupled.

The connectors used with the wiring system of an air bag or the like of automobiles require strict checking to ensure that the connectors are completely fitted.

A conventional connector having a fitting detection function is disclosed in Japanese Patent Laid Open No. 6-310209. FIGS. 1 to 4 show a conventional connector disclosed in this related art.

As shown in FIG. 1, a female terminal 5 is arranged in a housing 3 of a male connector 1, and a male terminal 6 is arranged in a housing 4 of a female connector 2. The male connector housing 3 is fitted in the female connector housing 4 thereby to couple the male terminal 6 and the female terminal 5 to each other. A flexible lock member 7 is mounted in the male connector housing 3, and an engaging section 8 is formed on the female connector housing 4. The flexible lock member 7 is locked to the engaging section 8 when the male connector housing 3 and the female connector housing 4 are fitted to each other. The flexible lock member 7 of the male connector housing 3 has a shorting electrode 9 as shown in FIG. 2, and the female connector housing 4 includes a pair of detection electrodes **10*a*, 10*b*** as shown in FIG. 2.

Upon fitting of the male connector 1 and the female connector 2 to each other, as shown in FIG. 3, the flexible lock member 7 is displaced. With further progress of fitting, as shown in FIG. 4, the connectors 1 and 2 are completely fitted on each other, so that the flexible lock member 7 is restored. The shorting electrode 9 thus comes into contact with the detection electrodes **10*a*, 10*b* thereby to short the two detection electrodes 10*a*, 10*b* to each other. Consequently, it is possible to detect whether the male and female connectors 1 and 2 have been completely fitted on each other by electrically detecting the conduction of the electrodes 10*a*, 10*b***.

In the above-mentioned conventional technique, the connector housings 3 and 4 to be fitted include the shorting electrode 9 and the detection electrodes **10*a*, 10*b* making up fitting detection terminals. The shorting electrode 9 and the detection electrodes 10*a*, 10*b* come into contact with each other only after the housings 3 and 4 are fitted on each other. As a result, dust and dirt may attach to the mutual contact surfaces of the shorting electrode 9 and the detection electrodes 10*a*, 10*b* before the connectors 1 and 2 are fitted on each other. In such a case, an electrical contact failure may occur and the fitting between the male and female connectors 1 and 2** may become impossible to detect.

SUMMARY OF THE INVENTION

In view of the above-mentioned situation, the object of the present invention is to provide a connector fitting detection apparatus capable of preventing dust and dirt from attaching to the mutual contact surfaces of the fitting detection terminals for an improved fitting detection reliability.

In order to achieve the above-mentioned object, according to the present invention, there is provided a fitting detection apparatus comprising a slider mounted on a first one of a pair of connector housings adapted to fit each other, which slider is set in its original position while the connector housings are not fitted on each other and adapted to move with the fitting operation of the second connector housing in such a manner as to leave its original position in the process of fitting of the two connector housings and return to its original position once the two connector housings are completely fitted on each other, and a plurality of fitting detection terminals arranged on the first connector housing and on the slider, respectively, and adapted to contact each other when the slider is in its original position and come out of contact with each other when the slider leaves its original position.

With this configuration, once the first connector housing is fitted on the second connector housing, the slider moves with the fitting operation. In the process of fitting operation, on the other hand, the slider leaves its original position so that the fitting detection terminals come out of contact with each other, while upon complete fitting, the slider returns to its original position thereby causing the fitting detection terminals to come into contact with each other again. In this way, it is possible to decide whether the connector housings are in the process of fitting (in semi-fitted state) or have been completely fitted on each other by electrically detecting the contact between the fitting detection terminals.

Also, the fitting detection terminals are in contact with each other when the connector housings are not fitted or completely fitted on each other, and are out of contact with each other only during a predetermined period of time in the process of fitting. Dust and dirt can therefore be completely prevented from attaching on the mutual contact surfaces of the fitting detection terminals, and the reliability of connector fitting detection thus is improved.

Also, the connector fitting detection apparatus according to the invention may further comprise decision means capable of determining the mutual contact of common terminals of the connector housings whereby to decide on the contact of the fitting detection terminals to each other.

With this configuration, while the connector housings are not fitted on each other, the decision means is incapable of decision so that even in the case where the fitting detection terminals are in contact with each other, fails to produce any decision output. According as the second connector housing proceeds to fit on the first connector housing, the slider comes away from its original position and the fitting detection terminals come out of contact with each other, while the common terminals of the connector housings come into contact with each other at the same time, thereby setting the decision means in the state capable of decision.

Specifically, in the initial stage of the above-mentioned condition (i.e., after the common terminals come into contact with each other before the connector housings that have begun the fitting process are fitted on each other), the decision means is capable of decision and the fitting detection terminals are not in contact with each other. The decision means, therefore, electrically detects the out-of-contact state of the fitting detection terminals and generates a decision output indicating that the connector housings are in the process of fitting. Then, once the connector housings have been completely fitted on each other, the slider returns to its original position and the fitting detection terminals come into contact with each other. The decision means, therefore, electrically detects the contact between the fitting detection terminals and generates a decision output indicating that the connector housings are in completely fitted state.

Consequently, the decision means can perform the decision operation by the power supplied from common terminals. In this way, the completely fitted state can be determined from the state of the common terminals.

Also, the slider may be configured in such a manner as to be biased to its original position by a spring and may have a slider drive protrusion with a cam inclined toward the direction in which the second connector housing is fitted. The second connector housing, on the other hand, has a slider pressure protrusion adapted to interfere with the slider drive protrusion and apply the sliding pressure to the cam thereby to move the slider away from its original position against the spring force when fitting on the first connector housing, so that when the second connector housing reaches the completely fitted position, the slider pressure protrusion passes the interference point with the slider drive protrusion.

With this configuration, when the second connector housing is fitted on the first connector housing, the slider pressure protrusion applies the sliding pressure to the cam of the slider drive protrusion. As a result, the slider leaves its original position against the force of the spring, with the result that the fitting detection terminals come out of contact with each other. According as the second connector housing further proceeds to fit on the first connector housing, the slider pressure protrusion passes the interference point with the slider drive protrusion. Therefore, the slider is returned to the original position by the spring force and the fitting detection terminals come into contact with each other.

Consequently, the slider is held in position automatically, and the fitting detection terminals are maintained in contact with each other, thereby preventing dust and dirt from attaching to the mutual contact surfaces thereof. Also, since the slider automatically returns to its original position, any specific manual operation is not required.

Further, the first connector housing includes a plurality of mating connector fitting portions, and the slider may be formed in a size covering these mating connector fitting portions and movable along the direction of arrangement of the mating connector fitting portions. The slider thus may be configured to have as many slider drive protrusions as the mating connector fitting portions.

With this configuration, once a mating connector is fitted, the slider moves and the fitting can be detected. In this way, as the mating connectors are successively fitted, the same slider and the same fitting detection terminals thus can detect the fitting of all the mating connectors. As a result, a compact connector fitting detection apparatus is realized with low cost Also, the fitting detection terminals can include a pair of detection electrodes arranged on the first connector housing and a shorting electrode arranged on the slider for shorting the detection electrodes by coming into contact with the detection electrodes when the slider is in position.

With this configuration, the provision of a pair of detection electrodes on the first connector housing, the provision of a shorting electrode on the slider and the fact that the detection electrodes are shorted by the shorting electrode when the slider is in its original position, can electrically detect the conduction between the detection electrodes thereby to detecting the fitting.

Also, the detection electrodes and the shorting electrode each can be configured to have a male terminal and a female terminal adapted to fit each other when the electrodes are in contact with each other.

This male-female fitting configuration between the detection electrodes and the shorting electrode cause the terminals to slide into contact with each other by forcing out dust and dirt, if any. As a result, the conductive state is secured for an improved reliability.

Alternatively, the detection electrodes and the shorting electrode can be so configured to have contact surfaces which come into contact with each other when the electrodes are in contact with each other.

With this configuration, a large fitting force is not required for fitting the connectors. In other words, the male-female fitting configuration between the detection electrodes and the shorting electrode requires a large fitting force for fitting the detection electrodes and the shorting electrode to each other and a correspondingly large spring force, which in turn requires a fitting operation against the large spring force at the time of fitting the connectors. The configuration under consideration, by contrast, the simple contact between the contact surfaces can save the spring force and can correspondingly reduce the force required for the connector fitting operation.

Also, in the male-female fitting configuration, the fitting is impossible and the adjustment of the relative positions of the male terminal and the female terminal is required in the case where the male terminal and the female terminal are displaced from position. In contrast, the present configuration, in which an error is absorbed within the contact surfaces in simple contact between the detection electrodes and the shorting electrode, eliminates the need of adjustment of the electrode positions and thereby simplifies the assembly work.

Further, the apparatus may further comprise a flexible engaging portion for provisionally engaging the slider at a position where the slider drive protrusion is displaced from the route of passage of the slider pressure protrusion when the second connector housing leaves the first connector housing.

With this configuration, the operation is simplified for separate the two connector housings in the fitted state from each other. Specifically, in the case where the second connector housing leaves the state fitted on the first connector housing, the presence of the slider drive protrusion in the route of separation of the slider pressure protrusion would prevent the second connector housing from leaving the first connector housing without moving the slider to a position where the second connector housing can so leave. With this configuration, on the other hand, the slider can be provisionally engaged at a position where the second connector housing can leave the first connector housing, and therefore the second connector housing can be separated with a simple operation.

Also, the apparatus may further comprise a provisional engagement release portion configured in such a manner that the second connector housing in the process of leaving the first housing connector comes into contact with the flexible engaging portion provisionally engaging the slider, thereby releasing the flexible engaging portion from the provisionally engaged state.

With this configuration, in the case where the second connector housing is caused to leave the first connector housing with the slider provisionally engaged by the flexible engaging portion, the flexible engaging portion is displaced and the provisional engagement is released. Consequently, the slider can be easily returned to its original position.

DESCRIPTION OF THE PREFERRED EMBODIMENTS

A connector unit including a fitting detection apparatus according to an embodiment of the present invention will be explained with reference to the accompanying drawings.

First, a connector unit according to a first embodiment of the invention will be described with reference to FIGS. 5 to 14.

Figure 5:
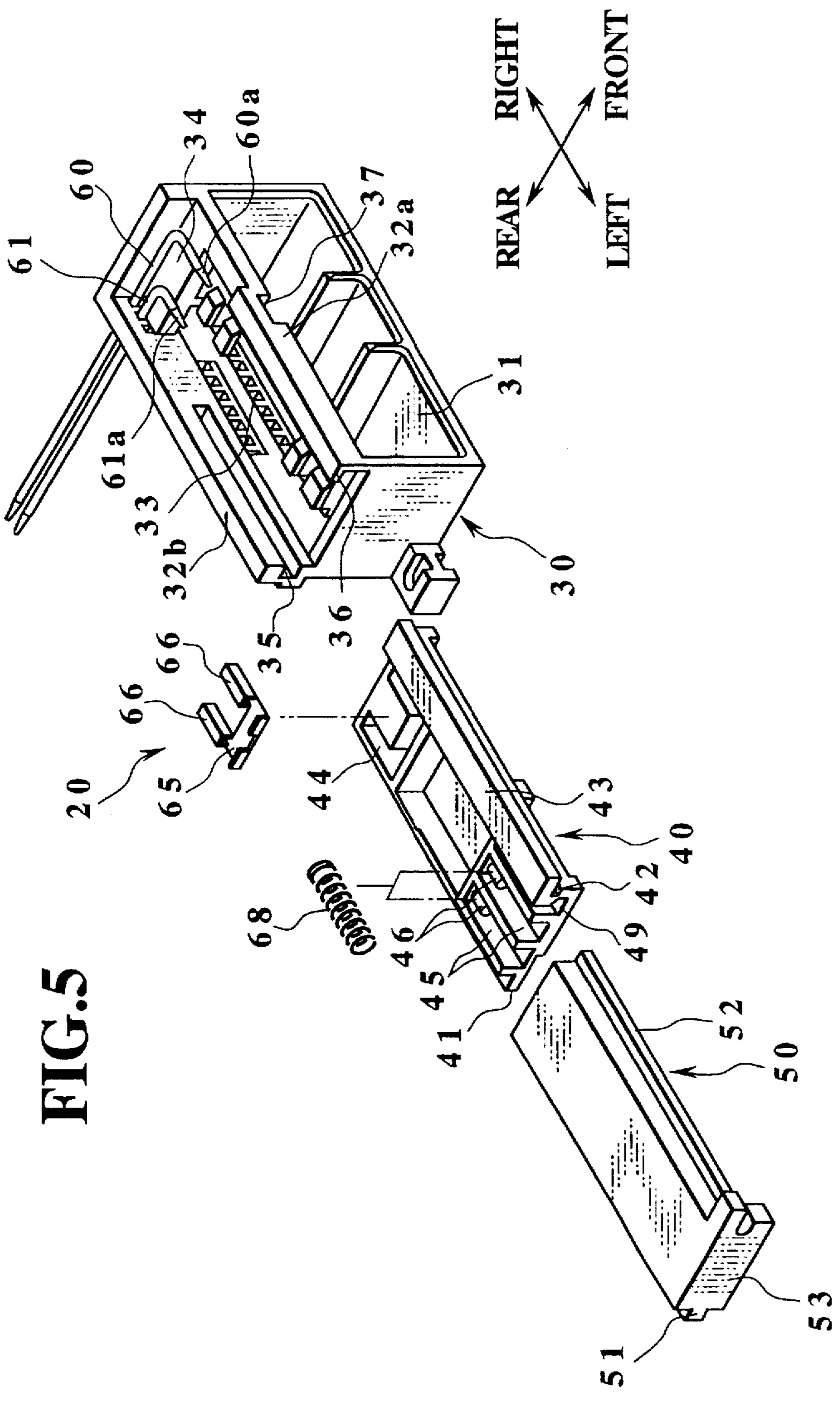
FIG. 5 is an exploded perspective view showing a female connector according to a first embodiment of the invention.
Figure 10:
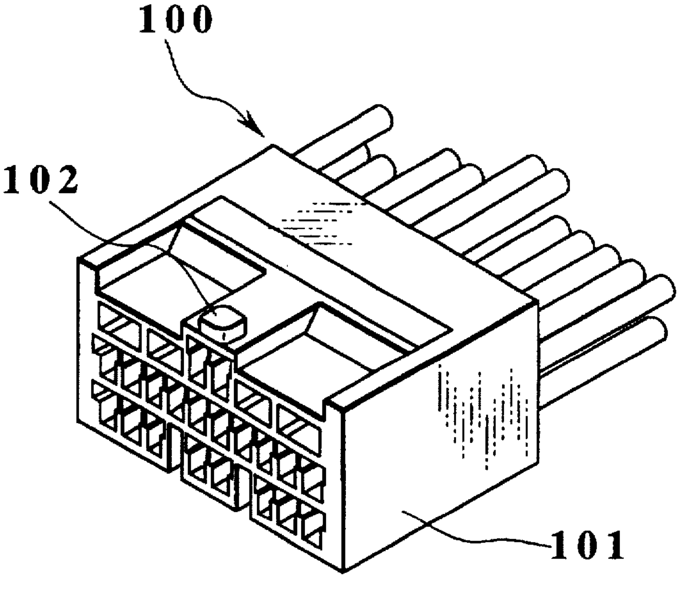
FIG. 10 is a perspective view showing a male connector used in the first embodiment of the invention.

The connector unit according to the first embodiment includes a female connector 20 shown exploded in FIG. 5 in combination with a male connector 100 having the external appearance shown in FIG. 10. The description that follows will be made mainly about the female connector 20 that has a significant feature.

Figure 6A:
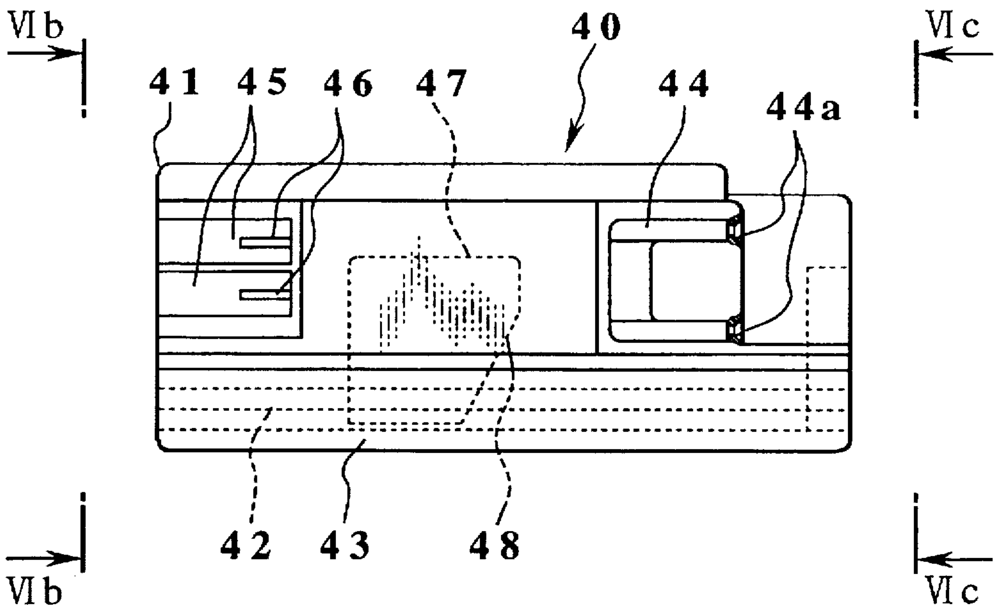
FIG. 6A is a plan view of a slider used with the female connector according to the first embodiment of the invention.
Figure 6B:
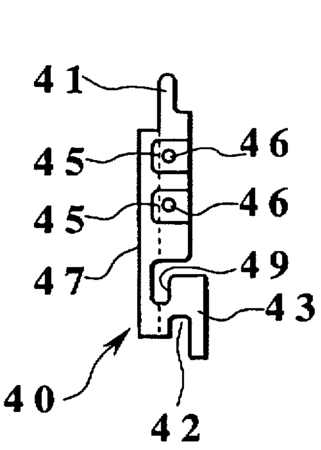
FIG. 6B is a sectional view taken in line VIb—VIb in FIG. 6A.
Figure 6C:
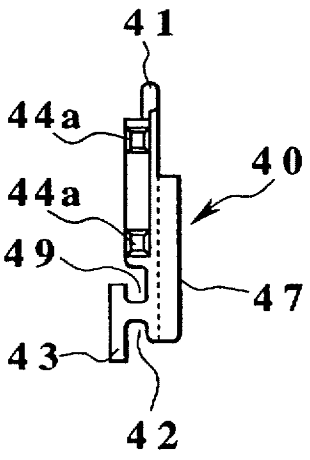
FIG. 6C is a sectional view taken in line VIc—VIc in FIG. 6A.
Figure 7:
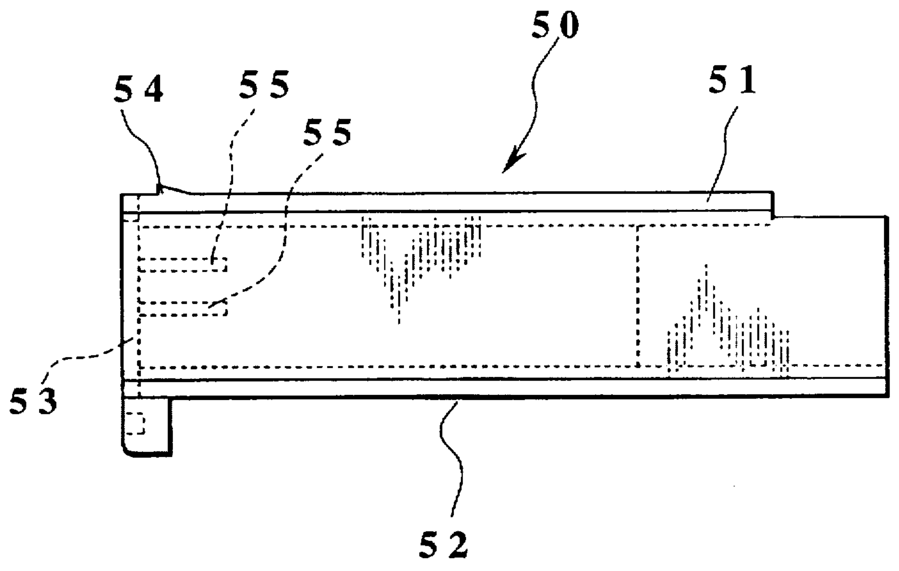
FIG. 7 is a plan view showing a cover used for the female connector according to the first embodiment of the invention.
Figure 8:
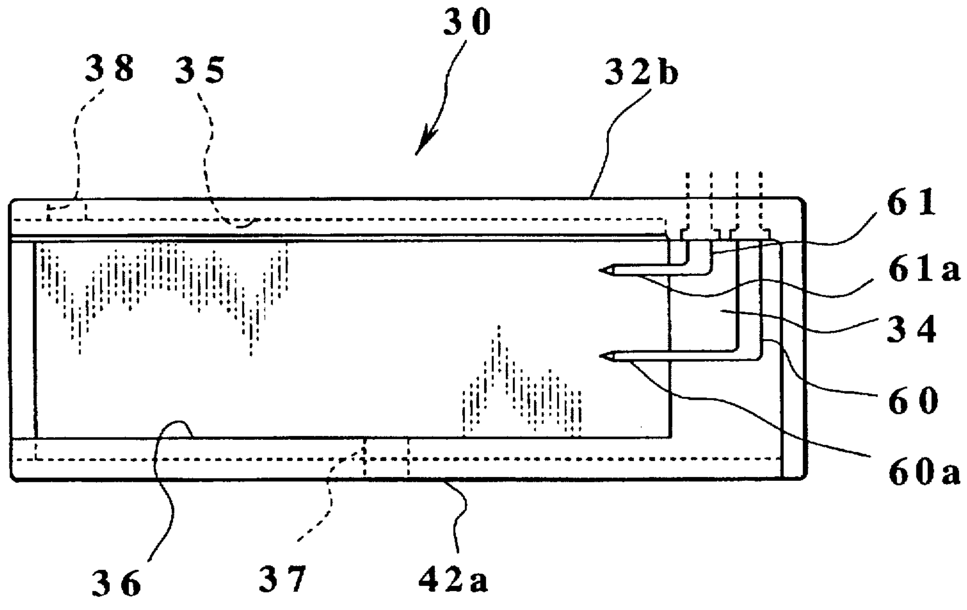
FIG. 8 is a plan view showing a housing of the female connector according to the first embodiment of the invention.
Figure 9:
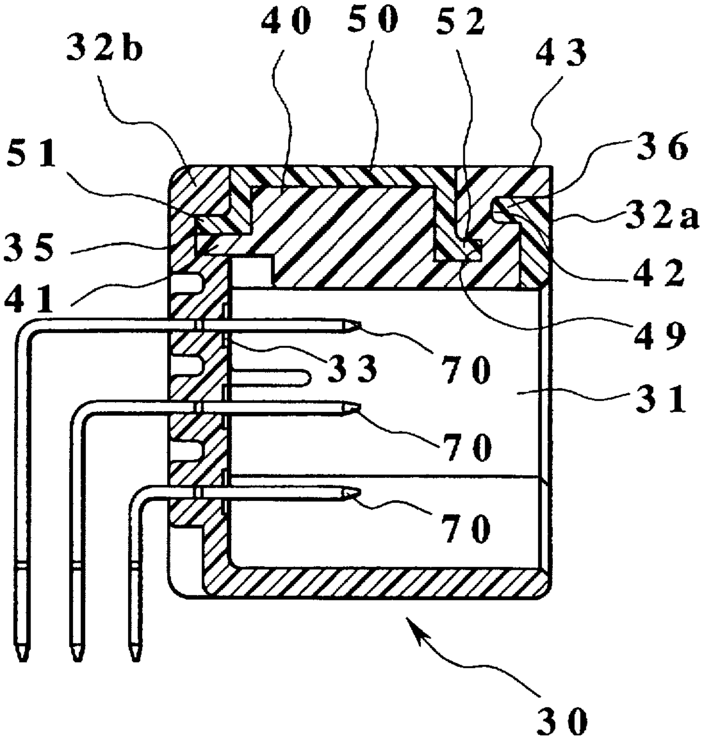
FIG. 9 is a sectional view of the essential parts of the female connector according to the first embodiment of the invention.

FIG. 5 is an exploded perspective view of the female connector 20. The female connector 20 includes a female connector housing 30, a slider 40, a cover 50, two detection electrodes 60, 61 and a shorting electrode 65 making up fitting detection terminals, a spring 68 and a plurality of common terminals not shown. FIG. 6A is a plan view of the slider 40. FIG. 6B is a sectional view taken in line VIb—VIb, and FIG. 6C is a sectional view taken in line VIc—VIc. Also, FIG. 7 is a plan view of the cover 50. FIG. 8 is a plan view of the female connector housing 30, and FIG. 9 is a sectional view of the female connector 20 including a combination of the female connector housing 30, the slider 40, the cover 50, the common terminals 70, etc. Also, FIGS. 11 to 14 are plan views showing the relation between the component elements.

As shown in FIGS. 5 and 8, the female connector housing 30 is in the shape of a rectangular box with a side constituting the front having an opening of the mating connector fitting portion 31. The female connector housing 30 has the upper side thereof open, and the front and rear edges of the upper side are formed with guide walls 32*a*, 32*b* extending in lateral directions. Also, the rear wall of the female connector housing 30 is formed with a plurality of terminal insertion holes 33 into which the common terminals 70 (FIG. 9) are fixedly inserted. The upper right end of the female connector housing, as viewed from the front thereof, is formed with a detection electrode setting portion 34 in which a pair of detection electrodes 60, 61 are set as fitting detection terminals.

The detection electrodes 60, 61 have the base thereof inserted into the through holes formed in the rear guide wall 32*b*. The bases of the detection electrodes 60, 61 are thus protruded out of the housing 30 like the common terminals 70. The forward ends of the detection electrodes 60, 61 are bent at right angles and extend straight leftward of the housing 30. The forward ends of the detection electrodes 60, 62 thus constitute the male terminals 60*a*, 61*a*, respectively.

Also, a slide groove 35 is formed in the rear guide wall 32*b* of the female connector housing 30, and a slide guide 36 is protruded from the front guide wall 32*a*. The slide groove 35 and the slide guide 36 are formed from the left end of the female connector housing 30. Also, a recess 37, through which a slider pressure protrusion 102 protruded from the upper surface of the connector housing 101 of the male connector 100 shown in FIG. 10 is to be inserted, is formed on the lower end of the front guide wall 32*a* constituting an open edge of a mating connector fitting portion 31. Further, as shown in FIG. 8, a lock hole 38 is formed in the bottom of the slide groove 35. The lock hole 38 is arranged toward the left end of the female connector housing 30.

Now, the slider 40 will be explained with reference to FIGS. 5 and 6.

The slider 40, which is fitted in the upper surface of the female connector housing 30, is movable in lateral directions. The slider 40 includes, in the front and rear side edges thereof, a guide protrusion 41 fitted in the slide groove 35 and a guide groove 42 fitted in the slide guide 36, respectively. Also, an exposure wall 43 is formed on the upper side of the guide groove 42. The exposure wall 43 is exposed outside from the gap between the cover 50 and the female connector housing 30. A cover engaging groove 49 is formed in opposed relation to the guide groove 42 at the root of the exposure wall 43.

Also, the left end of the upper surface of the slider 40 is formed with two spring support grooves 45 of a predetermined length extending rightward from the left end of the slider 40. Each spring support groove 45 has a coil spring 68 arranged therein. Each coil spring 68 is held fixedly by a spring support protrusion 46 protruded from the deep end (right end wall) of the spring support groove 45. Further, the right end of the upper surface of the slider 40 is formed with a channel-shaped shorting electrode support groove (fitting detection terminal support groove) 44 with the two forward ends thereof directed rightward. The shorting electrode support groove 44 is fitted with a channel-shaped shorting electrode (fitting detection terminal). The shorting electrode 65 is for shorting the two detection electrodes 60, 61 and has each of the two forward ends thereof formed with a female terminal 66 adapted to fit with the male terminals 60*a*, 61*a* of the detection electrodes 60, 61, respectively. The forward end of each female terminal 66, as shown in FIG. 6C, is exposed rightward of the slider 40 via a through hole 44*a* formed in the forward end wall of the shorting electrode support groove 44.

The lower surface of the slider 40, as shown in FIG. 6A, is formed with a slider drive protrusion 47 trapezoidal in plan view for driving the slider 40. The right end of the slider drive protrusion 47 is formed with a cam section 48 inclined longitudinally (in the direction of fitting with the mating connector). The cam section 48 is formed in such a manner as to chamfer a corner of the trapezoidal slider drive protrusion 47 and has a forward end (rear end) extending straight in parallel to the longitudinal direction (in the direction of fitting the mating connector). The cam section 48 is where the slider pressure protrusion 102 of the male connector housing 101 applies a sliding pressure when the male connector 100 shown in FIG. 10 is fitted in the female connector 20.

The slider drive protrusion 47 is formed in such a (longitudinal) size as not to interfere with the slider pressure protrusion 102 when the female and male connectors 20, 100 are completely fitted with each other.

Now, the cover 50 will be explained with reference to FIGS. 5 and 7.

The cover 50 is tabular in shape and has a rear side end with an engaging protrusion 51 adapted to be fitted in the slider groove 35 of the female connector housing 30. The cover 50 also has a front side end with an engaging protrusion 52 adapted to be fitted in the cover engaging groove 49 of the slider 40. Also, the left end of the cover 50 is formed with a retaining wall 53 for preventing the slider 40 from coming off. The retaining wall 53 has a spring holding protrusion 55. Further, as shown in FIG. 7, the left end of the engaging protrusion 51 on the rear side edge of the female connector 20 is formed with a lock protrusion 54 adapted to engage the lock hole 38 of the female connector housing 30.

The upper surface of the female connector housing 30 having the above-mentioned configuration is fitted with the slider 40 with the cover 50 disposed thereon. The female connector 20 having a section as shown in FIG. 9 is thus configured.

In this female connector 20, the slider 40 is movable by a predetermined lateral length, and kept biased to its original position to the extreme right by the force of the spring 68. Consequently, as long as the slider 40 is in its original position, the force of the spring 68 causes the shorting electrode 65 and the female and male terminals 66, 60*a*, 61*a* of the detection electrodes 60, 61 to fit each other thereby to short the detection electrodes 60, 61. In the case where the slider 40 moves leftward away from its original position, on the other hand, the female and male terminals 66, 60*a*, 61*a* are disengaged from each other thereby to terminate the shorting.

Figure 11:
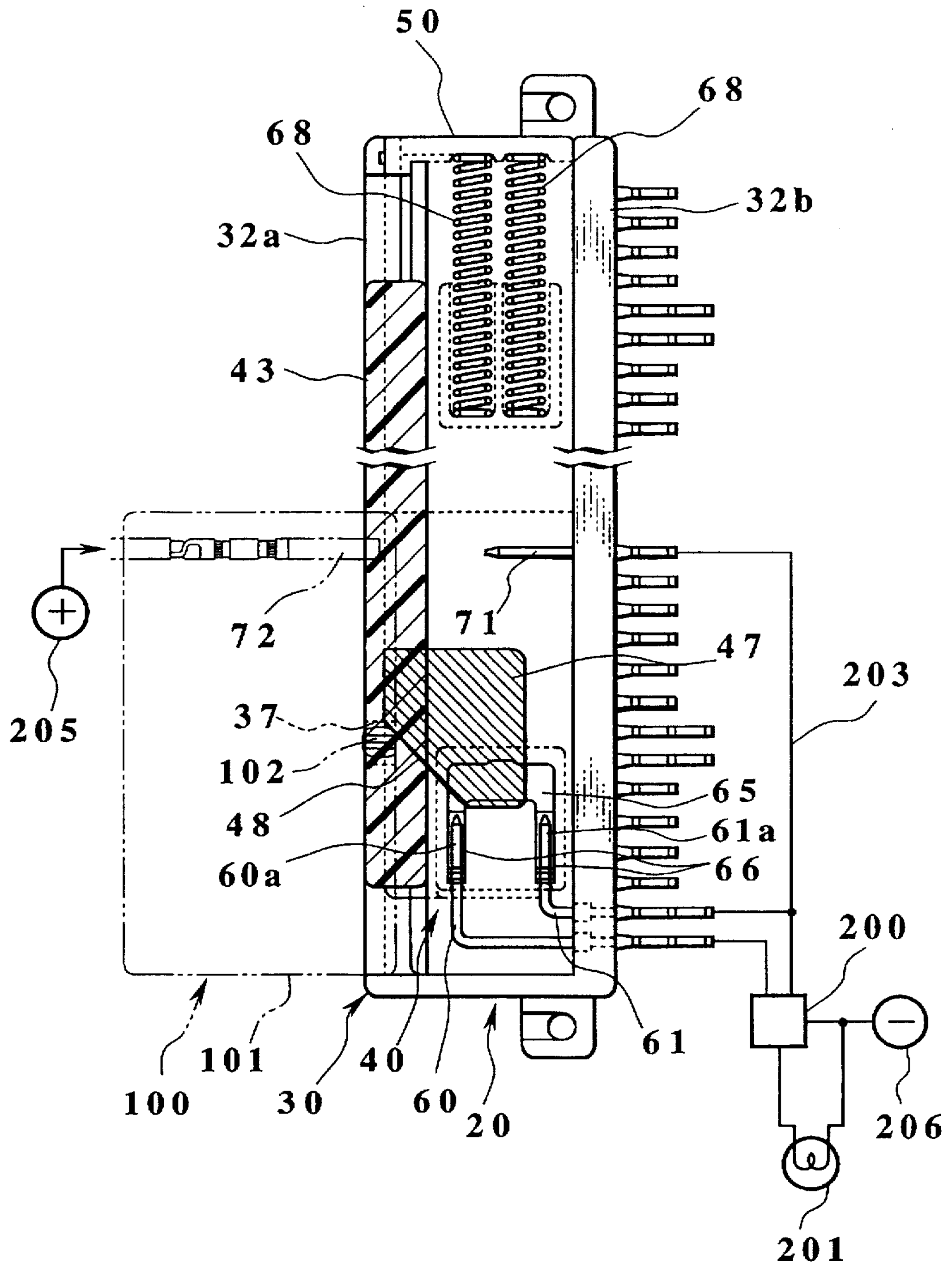
FIG. 11 is a plan view showing the relation between the component elements in the initial stage of fitting of the connectors according to the first embodiment of the invention.

FIG. 11 schematically shows the relation between the component elements. The relation between the detection electrodes 60, 61 and the shorting electrode 65 and the relation between the cam section 48 of the slider drive protrusion 47 and the slider pressure protrusion 102 are shown in the lower side of the drawing. Also, the state of the spring 68 is shown in the upper side of the drawing.

A set of the common terminals 72, 71 of the male connector 100 and the female connector 20 is for supplying power. The common terminal 72 of the male connector 100, for example, is connected to the positive electrode 205 of a power supply, and the common terminal 71 of the female connector 20 is connected to a decision unit (decision means) 200 through a wiring 203. Also, the decision unit 200 is electrically connected also with the two detection electrodes 60, 61. The decision unit 200 decides whether the female and male connectors 20, 100 are fitted with each other in accordance with the power input through the common terminal 71 and a signal input thereto indicating whether the two detection electrodes 60, 61 are shorted or not. The decision unit 200 thus turns on a warning lamp 201 constituting an alarm means, thereby informing the operator as required. In FIG. 11, numeral 206 designates a negative electrode for grounding the decision unit 200 and the warning lamp 201.

Now, the operation performed by fitting the connectors will be explained with reference to FIGS. 11 to 14.

As long as the male connector 100 is not (has yet to be) fitted in the female connector 20, the common terminals 71, 72 are out of contact with each other, and therefore the decision unit 200 is not supplied with power. At this time, the shorting electrode 65, which is fitted in the detection electrodes 60, 61, does not produce any decision output since the decision unit 200 is not in decision mode. The warning lamp 201 therefore is out.

Figure 12:
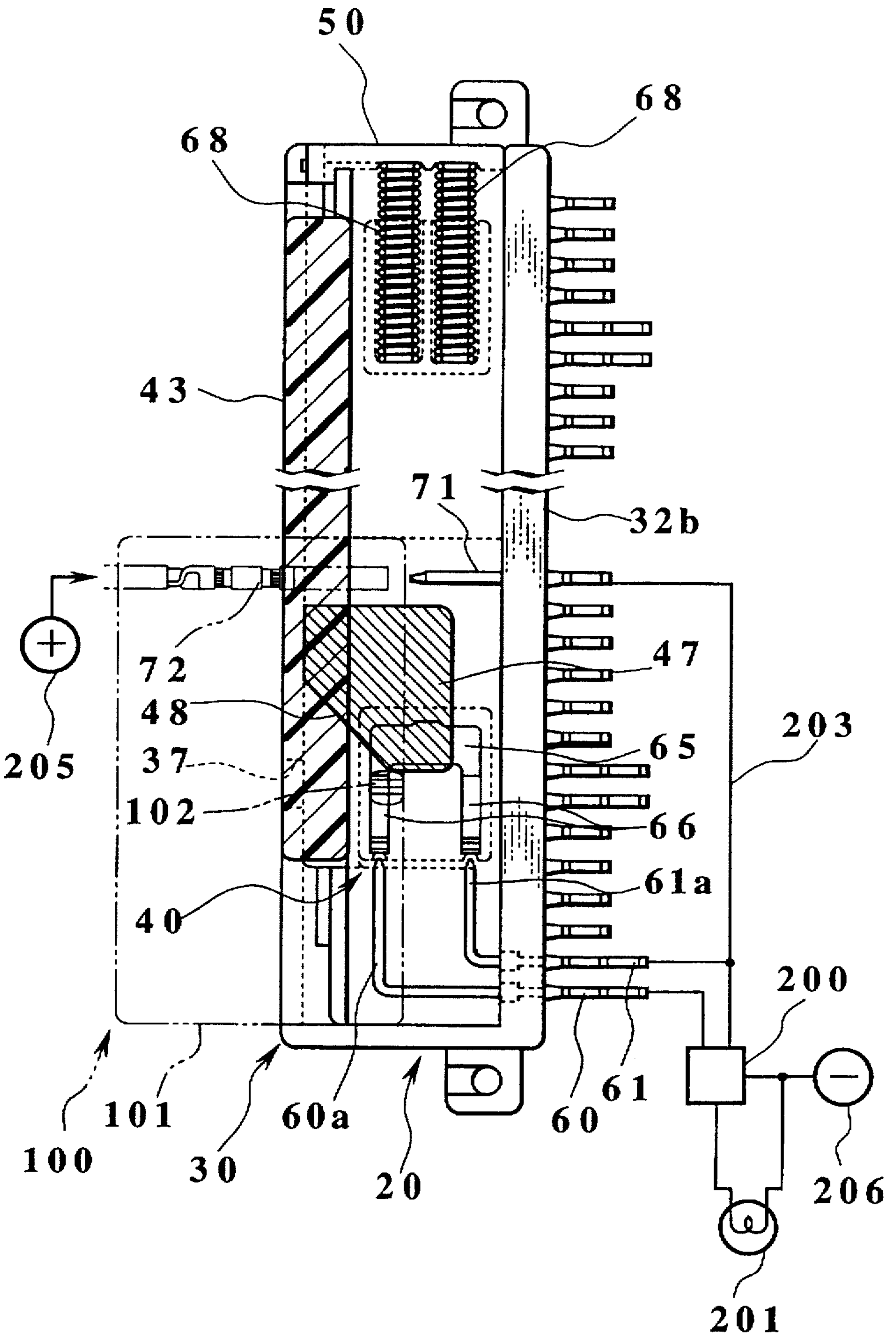
FIG. 12 is a plan view showing the relation between the component elements in the stage of fitting (in the process of fitting) next to FIG. 11.

Once the male connector 100 is fitted in the female connector 20 from this state as shown in FIG. 11, the slider pressure protrusion 102 of the male connector 100 comes into contact with the cam section 48 of the slider drive protrusion 47. With the progress of the fitting of the connectors, as shown in FIG. 12, the slider pressure protrusion 102 applies a sliding pressure on the inclined cam section 48, so that the slider 40 comes away from its original position against the force of the spring 68. As a result, the shorting electrode 65 leaves the detection electrodes 60, 61 out of contact with each other.

Figure 13:
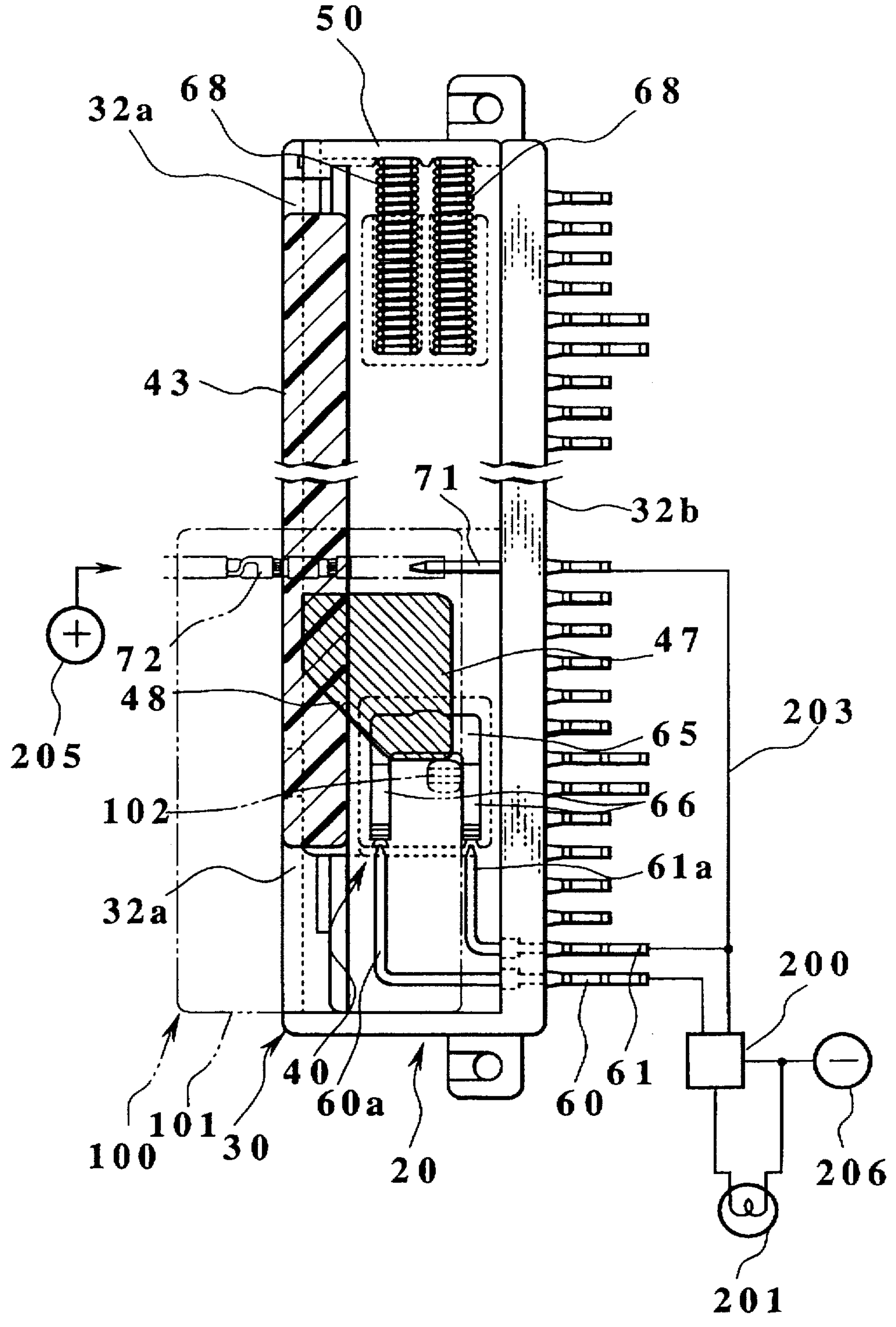
FIG. 13 is a plan view showing the relation between the component elements in the stage of fitting (in the process of fitting) next to FIG. 12.

With a further progress of the fitting, as shown in FIG. 13, the slider pressure protrusion 102 passes the cam section 48 and reaches the forward linear portion. In the process, the common terminal 72 of the male connector 100 comes into contact with the common terminal 71 of the female connector 20, so that power is supplied to the decision unit 200. In view of the fact that the detection electrodes 60, 61 are shorted and that the decision unit 200 thus is supplied with power through the common terminal 71, the decision unit 200 decides that the male connector 100 and the female connector 20 are in semi-fitted state and turns on the warning lamp 201.

Figure 14:
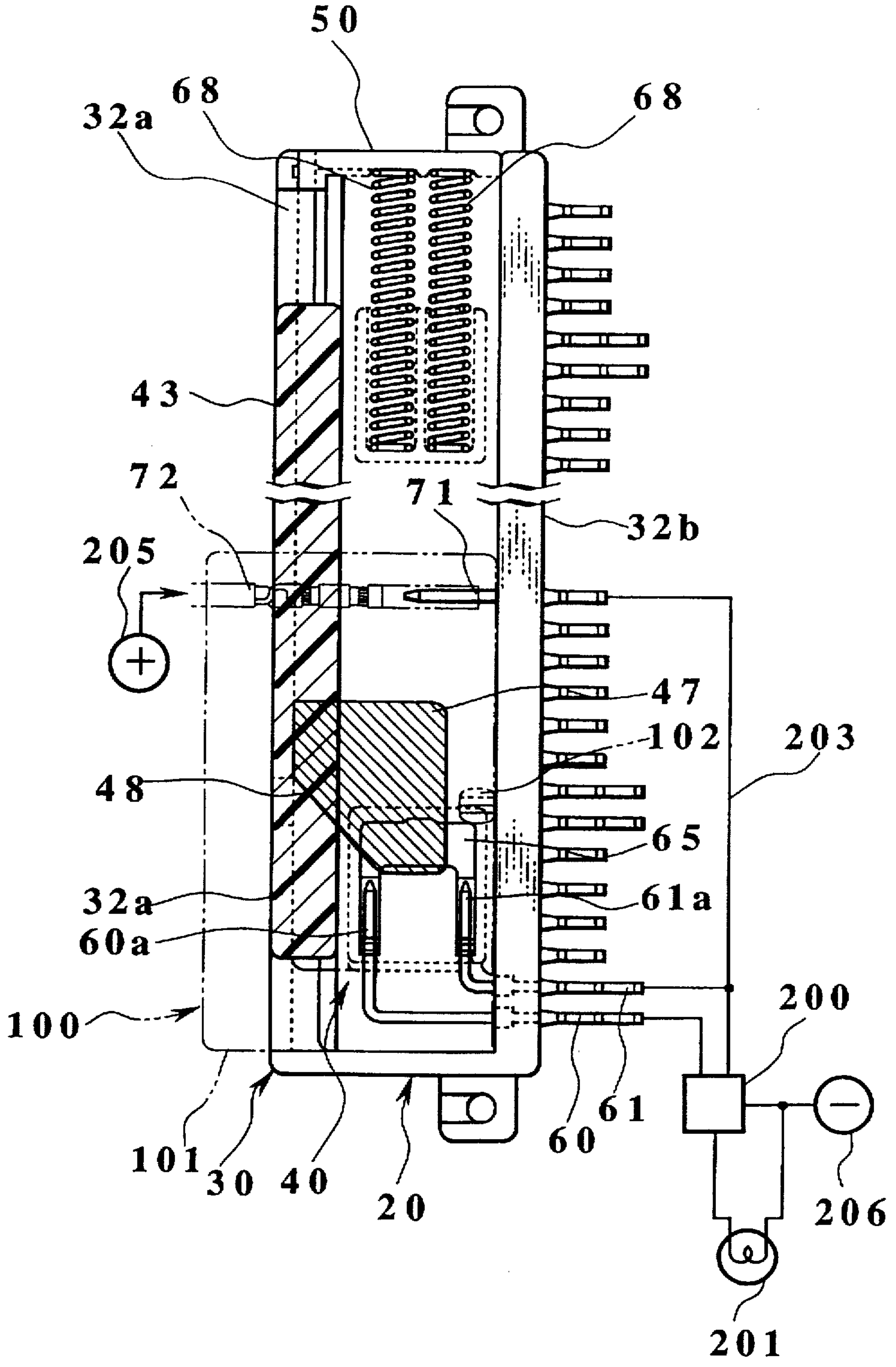
FIG. 14 is a plan view showing the relation between the component elements in the stage of fitting next to FIG. 13 (upon complete fitting).

Then, upon a further progress of fitting of the male connector 100, as shown in FIG. 14, the slider pressure protrusion 102 passes the interference point with the slider drive protrusion 47, and therefore the slider 40 is returned to its original position under the force of the spring 68. This operation causes the shorting electrode 65 to fit with the female terminals 66, 60*a*, 61*a* of the detection electrodes 60, 61, thereby shorting the two detection electrodes 60, 61. The decision unit 200 decides on a completely fitted state and turns off the warning lamp 201. All that is required of the operator, therefore, is to fit the male connector 100 from the time when the warning lamp 201 is turned on to the time when it is turned off. It is thus decided that the connectors are in semi-fitted state as long as the warning lamp 201 is on. Consequently, the female and male connectors 20, 100 can be completely fitted without fail.

A first one of the connectors, i.e., the female connector 20 in the case under consideration, is formed with a shorting electrode 65 and the detection electrodes 60, 61 as fitting detection terminals, which electrodes are fitted with each other when the connectors are yet to be fitted or when they completely fitted with each other, while the two fitting detection terminals are out of contact with each other only during the time when the connectors are in the process of fitting with each other. Therefore, dust and dirt are positively prevented from attaching to the mutual fitting surfaces (contact surfaces) between the shorting electrode 65 and the detection electrodes 60, 61, thereby improving the fitting detection reliability.

Now, a connector unit according to a second embodiment of the invention will be explained with reference to FIGS. 15 to 16.

Figure 15:
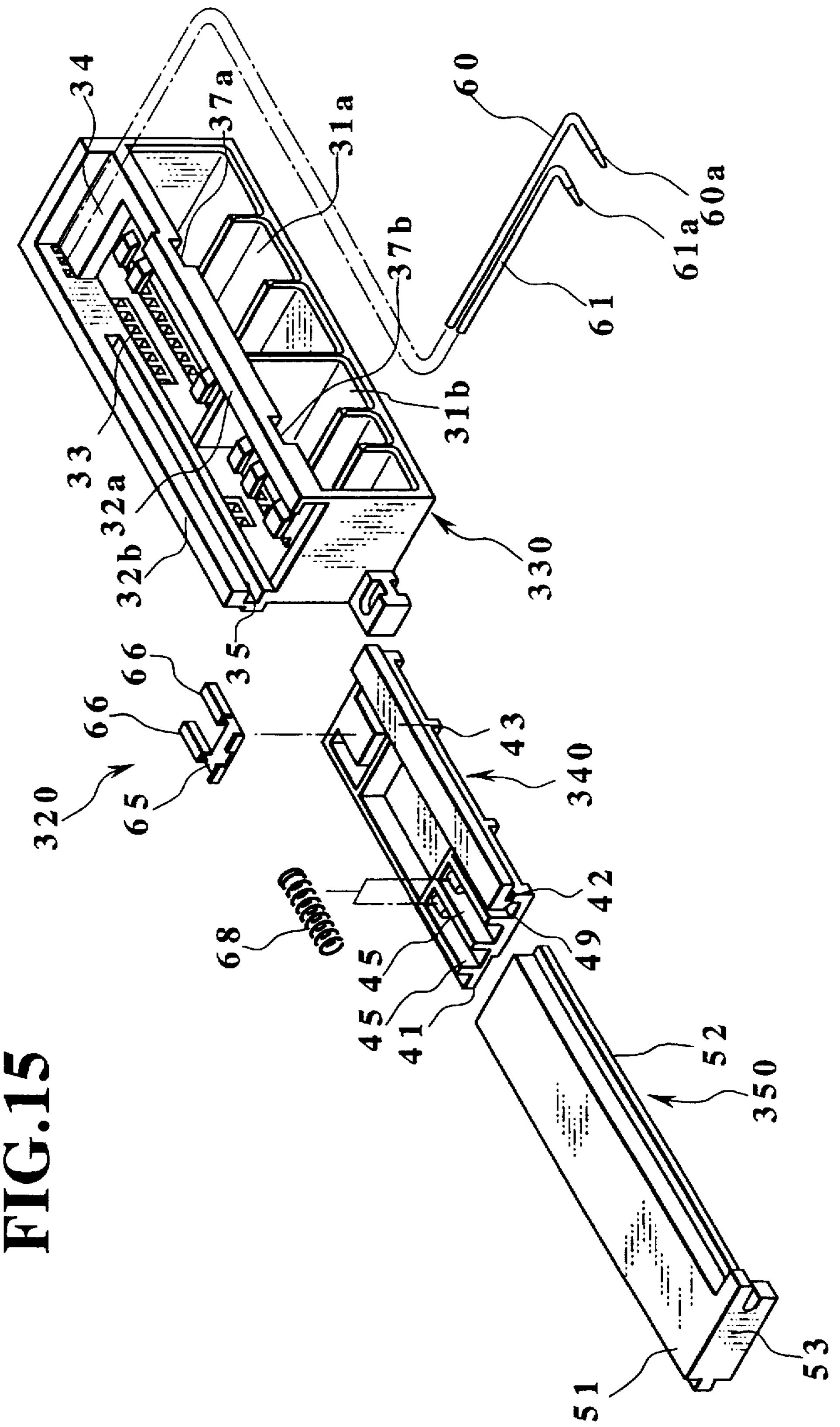
FIG. 15 is an exploded perspective view showing the female connector according to the second embodiment of the invention.

The connector unit according to the second embodiment of the invention includes a female connector 320 as shown in FIG. 15. The male connector 100, which is identical to that shown in FIG. 10, will not be described. FIG. 15 is an exploded perspective view of the female connector 320. This female connector 320 is different from the female connector 20 of the first embodiment in that the female connector 320 is adapted to be fitted with two male connectors 100. The female connector 320 is basically identical to the female connector 20 of the first embodiment in the remaining points, and therefore the same component parts thereof will be designated by the same reference numerals as the corresponding parts, respectively, of the first embodiment.

The female connector 320, as shown in FIG. 15, includes a female connector housing 330 having two laterally-juxtaposed mating connector fitting portions 31*a*, 31*b*, a slider 340 extending over the entire distance of arrangement of the two mating connector fitting portions 31*a*, 31*b*, a cover 350 formed sufficiently long to accommodate the two mating connector fitting portions 31*a*, 31*b*, two detection electrodes 60, 61 and a shorting electrode 65 constituting fitting detection terminals, a spring 68 and common terminals not shown.

The lower end of the front guide wall 32*a* of the female connector housing 330 is formed with two notches 37*a*, 37*b* corresponding to the slider pressure protrusions 102 of the male connectors 100. The remaining component parts are similar to those of the female connector housing 30 of the first embodiment.

Figure 16:
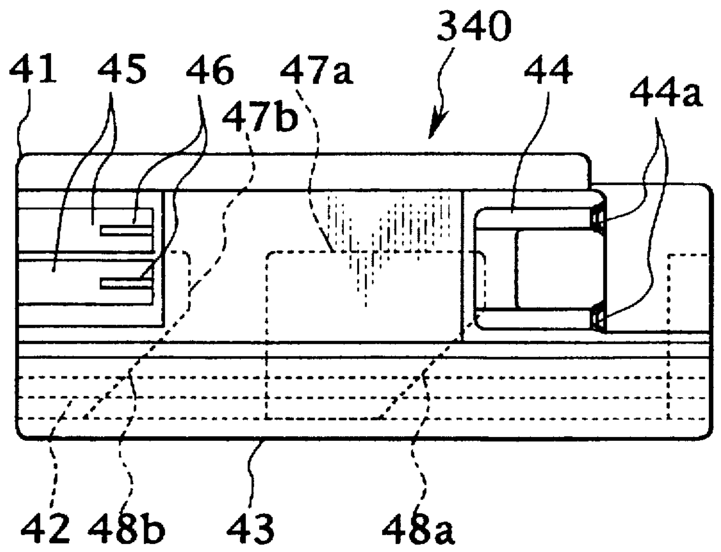
FIG. 16 is a plan view of a slider used with the female connector according to the second embodiment of the invention.

The slider 340, as shown in FIG. 16, has the lower surface thereof formed with two slider drive protrusion 47*a*, 47*b*, which in turn are formed with cam sections 48*a*, 48*b*, respectively. The cam sections 48*a* 48*b* are located in positions corresponding to the slider pressure protrusions 102 of the male connectors 100 fitted in the mating connector fitting portions 31*a*, 31*b*.

Figure 17:
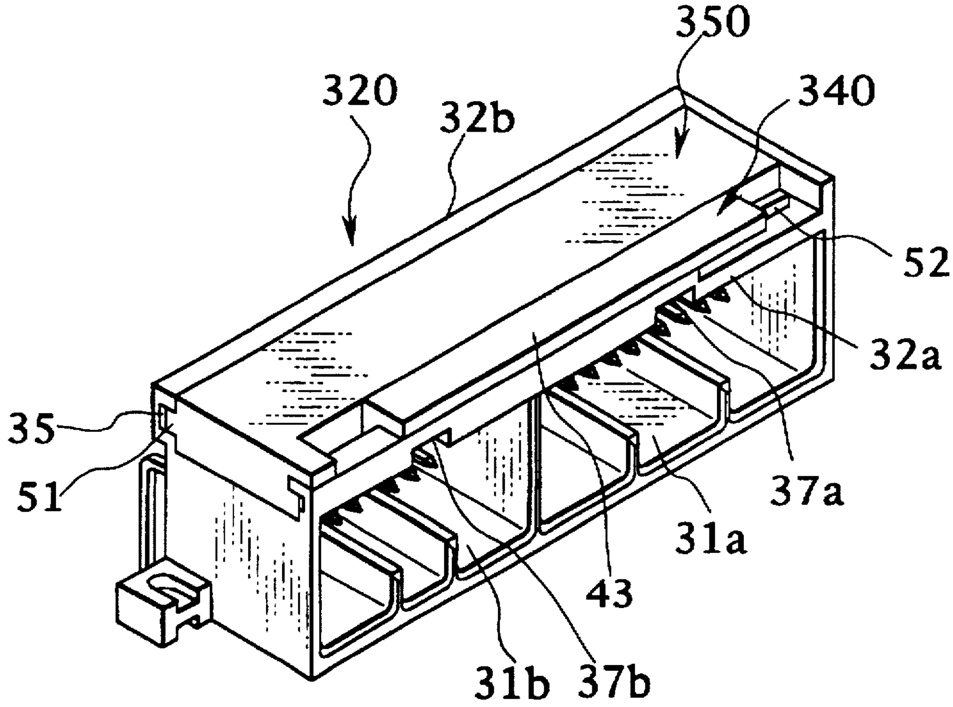
FIG. 17 is a diagram showing an external appearance of the female connector according to the second embodiment of the invention.
Figure 18:
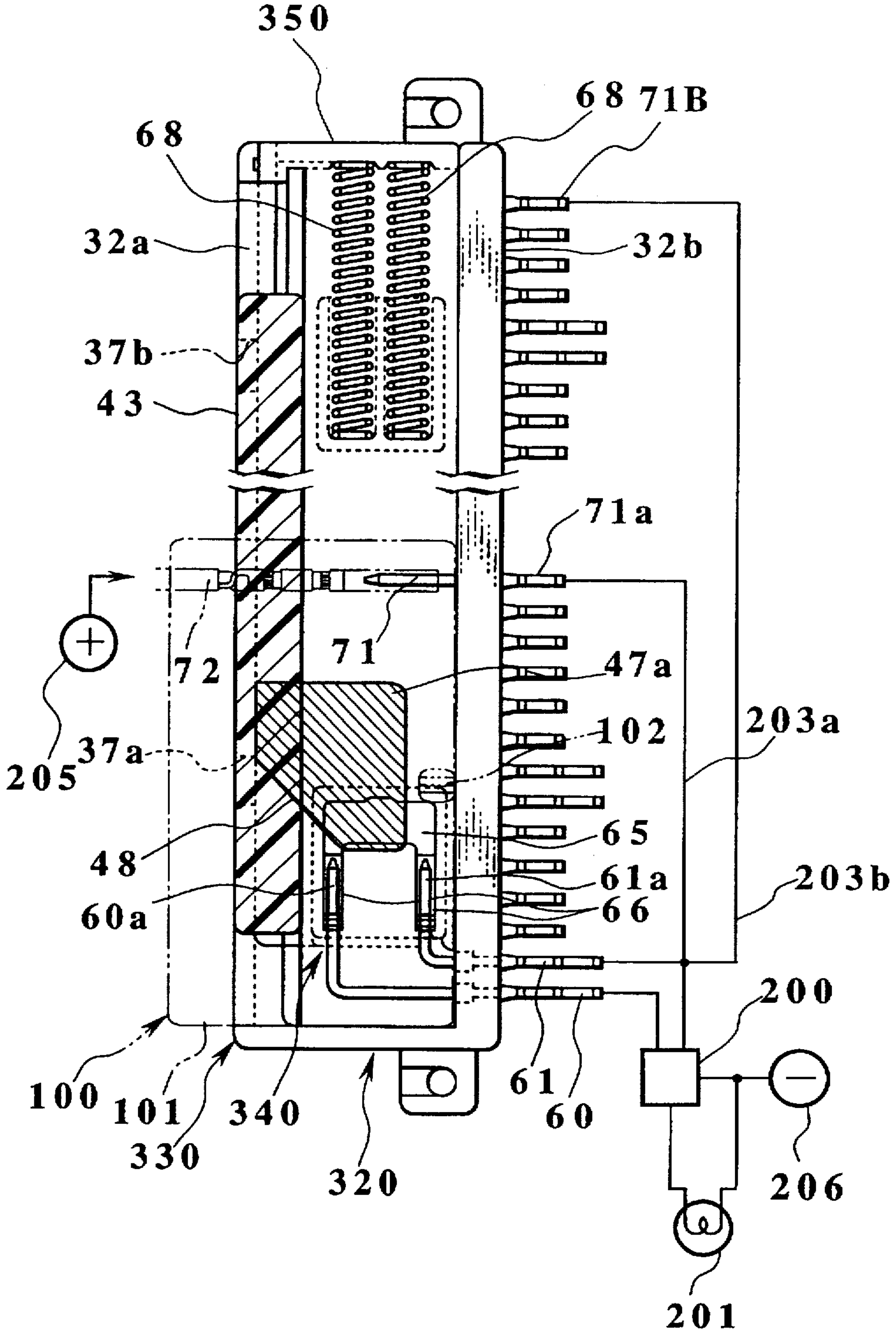
FIG. 18 is a plan view showing the relation between the component elements in the stage of fitting a male connector in the female connector according to the second embodiment of the invention.

FIG. 17 is a perspective view of a female connector 320 configured by assembling the component parts. FIG. 18 is a plan view showing the relation between the component parts, in which the mating connector fitting portion 31*a* on the right side (lower side in the drawing) is completely fitted with the male connector 100. As shown in FIG. 18, the decision unit 200 is connected with a wiring 203*a* from the common terminal 71*a* of the mating connector fitting portion 31*a* on the right side (on the lower side in the drawing) and a wiring 203*b* from the common terminal 71*b* of the mating connector fitting portion 31*b* on the left side (on the upper side in the drawing). In this connector, as shown in FIG. 18, the operation before the male connector 100 is fitted in the right (lower, in the drawing) mating connector fitting portion 31*a* is similar to the corresponding operation in the first embodiment. In this case, the slider pressure protrusion 102 of the male connector 100 interferes with the right (lower, in the drawing) slider drive protrusion 47*a*, thereby activating the slider 340.

Then, upon complete fitting of the right fitting portion, the left (upper, in the drawing) fitting operation is performed. In the case where the male connector 100 is fitted in the mating connector fitting portion 31*b* on the left side (on the upper side in the drawing), the slider pressure protrusion 102 of the male connector 100 interferes with the left slider drive protrusion 47*b* (FIG. 16), and the slider 340 performs a similar operation thereby to detect the fitted state. More specifically, upon complete fitting on the right side (on the lower side in the drawing), the decision unit 200, which is not in decision mode, produces, no output and the warning lamp 201 remains out. Upon subsequent fitting of the male connector 100 into the mating connector fitting portion 31*b* on the left side (upper side in the drawing) from this state, the decision unit 200 operates in the same way as when the male connector 100 is fitted in the mating fitting portion 31*a* on the right side (lower side in the drawing). As a result, when the male connector 100 is semi-fitted with the mating connector fitting portion 31*b*, the warning lamp 201 is turned on, while upon complete fitting, the warning lamp 201 is turned off.

With this connector unit, upon fitting of one male connector 100, the slider 340 is activated to permit detection of the fitting. According as the connectors 100 are successively fitted, therefore, the fitting of all the male connectors 100 can be detected by the same slider 340 and the fitting detection terminals (the shorting electrode 65 and the detection electrodes 60, 61). A fewer number of parts, therefore, can be used and the apparatus can be fabricated with a lower cost and a reduced size. Upon complete fitting of the male connector 100 into one mating connector fitting portion, the decision unit 200 is set to detect the fitting of the male connector 100 into the next mating connector fitting portion.

As to the number of the male connectors 100 to be fitted, three instead of two male connectors unlike in the shown case may be used with equal effect.

Figure 19A:
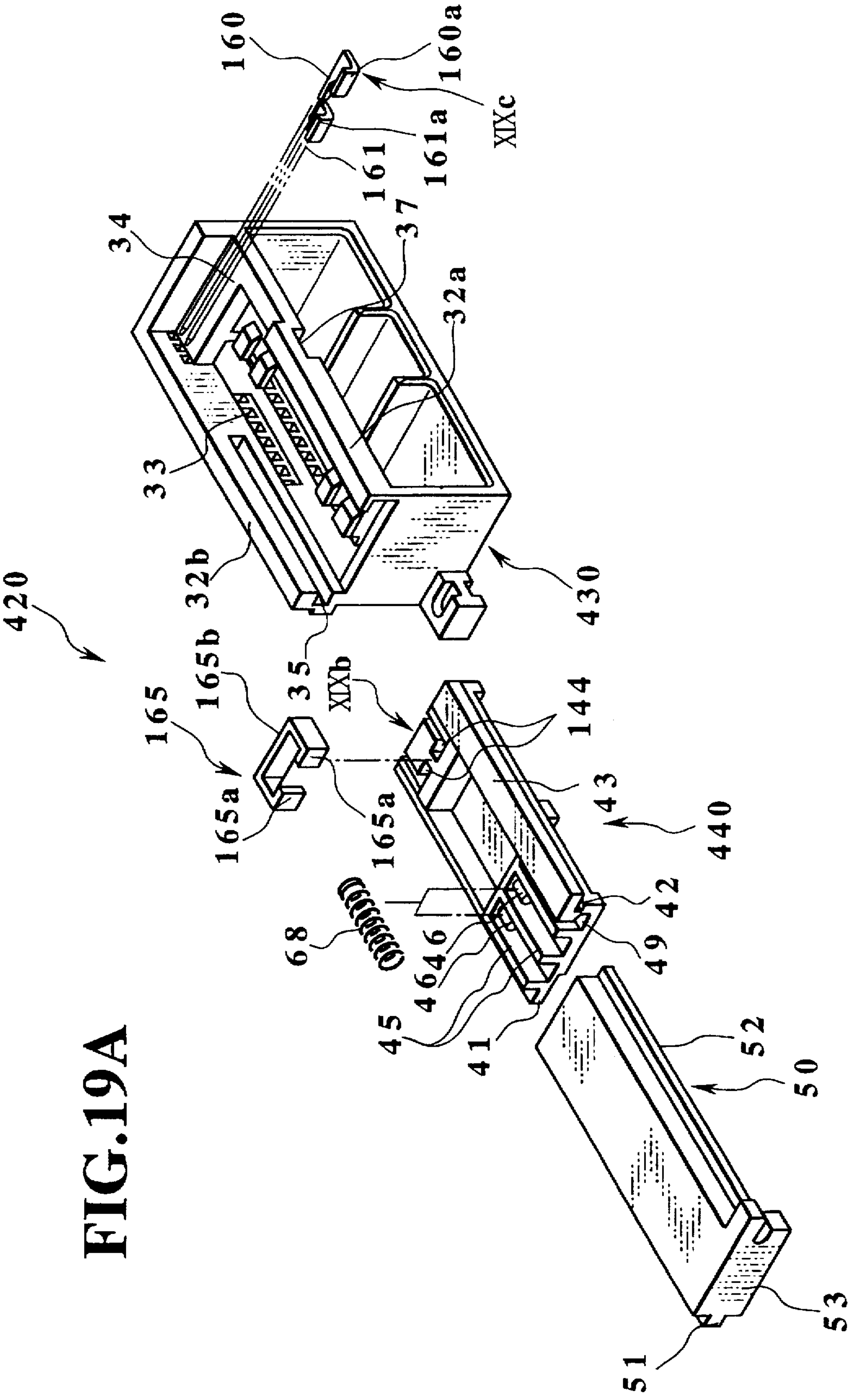
FIG. 19A is an exploded perspective view showing the female connector according to a third embodiment of the invention.
Figure 19B:
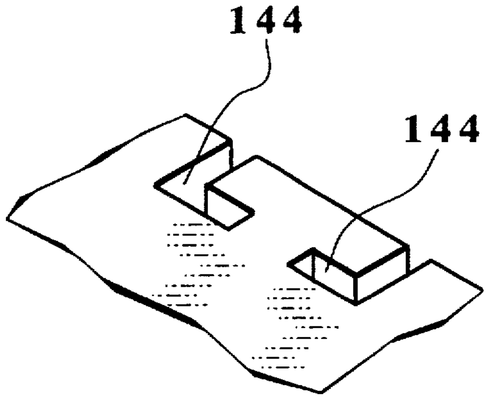
FIG. 19B is an enlarged sectional view of the part indicated by arrow XIXb in FIG. 19A.
Figure 19C:
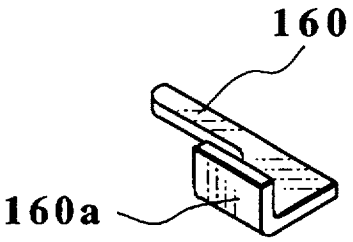
FIG. 19C is an enlarged sectional view of the part indicated by arrow XIXc in FIG. 19A.
Figure 20:
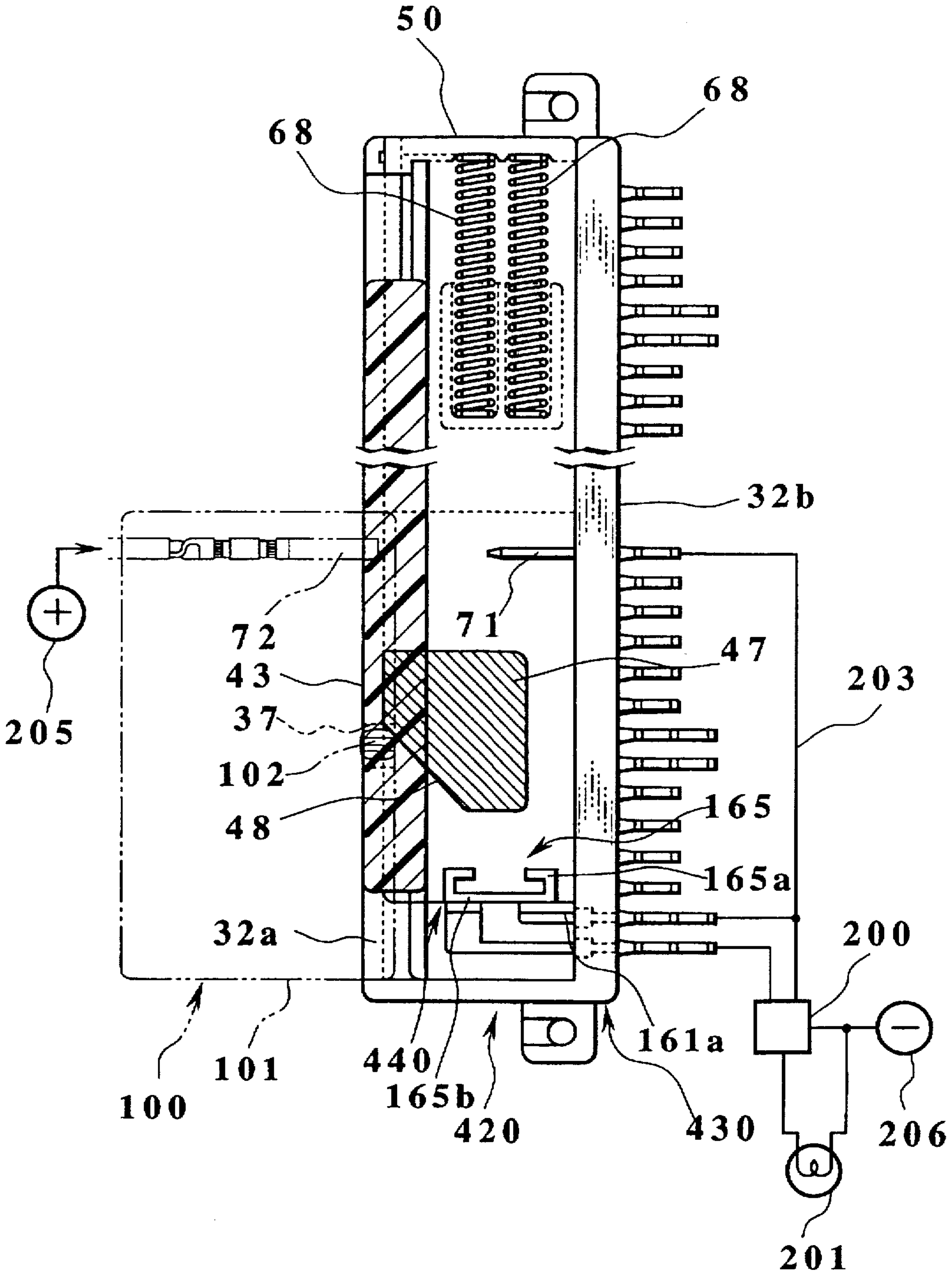
FIG. 20 is a plan view showing the relation between the component elements in the initial stage of fitting between the female connector and the male connector according to the third embodiment of the invention.

Now, the connector unit according to a third embodiment of the present invention will be explained with reference to FIGS. 19 and 20.

The connector unit according to the third embodiment is partially modified from the connector unit according to the first embodiment. Specifically, the detection electrodes 60, 61 and the shorting electrode 65 of male-female fitting type according to the first embodiment are modified to the detection electrodes 160, 161 and the shorting electrode 165 of simple contact type as shown in FIG. 19A. FIG. 20 is a plan view corresponding to FIG. 11.

As shown in FIG. 19A, a female connector housing 430 making up a female connector 420 has detection electrodes 160, 161 set therein. The forward end of the detection electrodes 160, 161 is formed with flat contact surfaces 160*a*, 161*a* directed to the left end of the female connector housing 430, as shown in FIG. 19C. Also, a slider 440 is formed with a pair of hook-shaped grooves 144 from the right end of the slider 440. Each hook-shaped groove 144 holds a bent forward end portion 165*a* of a shorting electrode 165 formed of a C-shaped bent metal. As a result, the shorting electrode 165 has two bent forward end portions 165*a*, 165*a* having an intermediate flat contact surface 165*b* facing the right end surface of the slider 440.

With this connector unit, when the slider 440 is located in it original potion at the right end, the energization force of the spring 68 causes the contact surface 165*b* of the shorting electrode 165 to come into contact with the contact surfaces 160*a*, 161*a* of the detection electrodes 160, 16, thereby causing the shorting electrode 165 to short the two detection electrodes 160, 161 with each other.

The basic operation of this connector unit is identical to that according to the first embodiment. The contacting between the contact surfaces 165*b*, 160*a*, 161*a* requires no large fitting force for fitting the connectors.

More specifically, the male-female fitting configuration between the detection electrodes and the shorting electrode as according to the first embodiment requires a large fitting force for fitting the detection electrodes and the shorting electrode to each other. The spring 68 also requires a corresponding magnitude of force, and the connectors are required to be fitted against a correspondingly larger force. In the case of the connector unit according to the third embodiment, however, the simple contact between the contact surfaces 165*b*, 160*a*, 161*a* can reduce the force of the spring 68. The male connector 100 can be fitted in the female connector 420 with a correspondingly smaller fitting force.

Also, although the male-female fitting configuration requires a positional adjustment in view of the fact that a displacement between the male terminal and the female terminal makes the fitting impossible. In the case of the connector according to the third embodiment, however, the simple contact between the contact surfaces 165*b*, 160*a*, 161*a* permits an error to be absorbed within the range of the contact surfaces 165*b*, 160*a*, 161*a*, and therefore the adjustment of the electrodes 160, 161, 165 is eliminated thereby to facilitate the assembly work.

Now, a connector unit according to a fourth embodiment of the invention will be explained with reference to FIGS. 21 to 27.

Figures 21A, 21B:
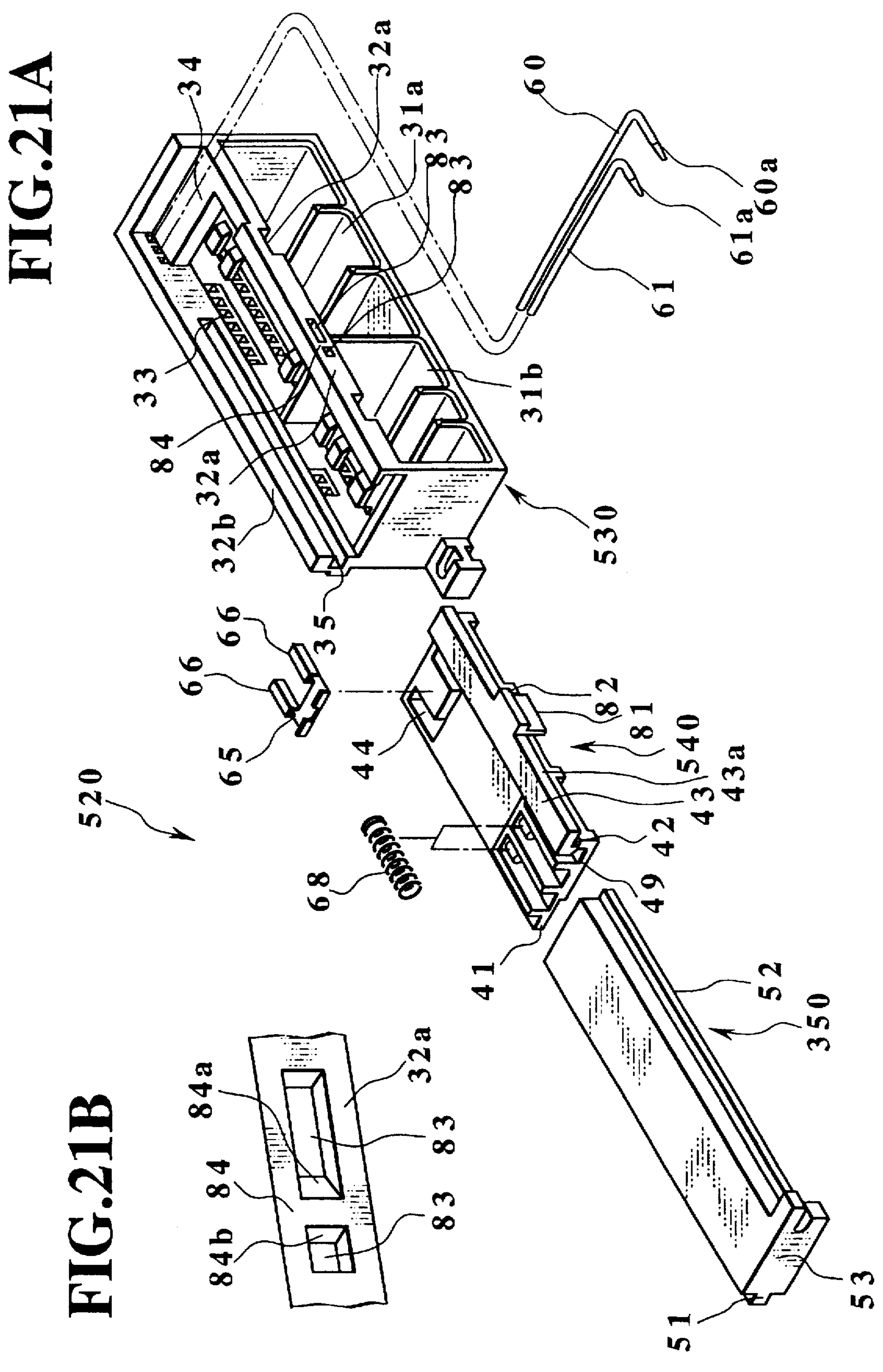
FIG. 21A is an exploded perspective view showing the female connector according to a fourth embodiment of the invention.
FIG. 21B is an enlarged sectional view of the part indicated by arrow XXIb in FIG. 21A.

The connector unit according to the fourth embodiment is partially modified from the female connector according to the second embodiment. FIG. 21A is an exploded perspective view of the female connector 520. The female connector 520 is different from the second embodiment in that a provisional engaging portion is formed by the use of the female connector housing 530 and the slider 540.

Figure 22A:
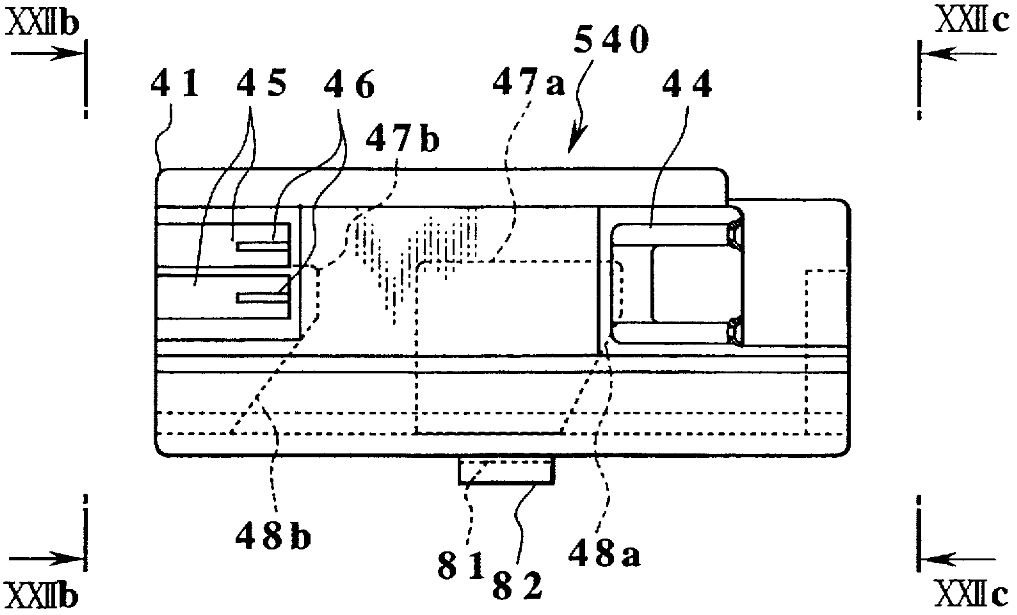
FIG. 22A is a plan view of a slider used with the female connector according to the fourth embodiment of the invention.
Figure 23:
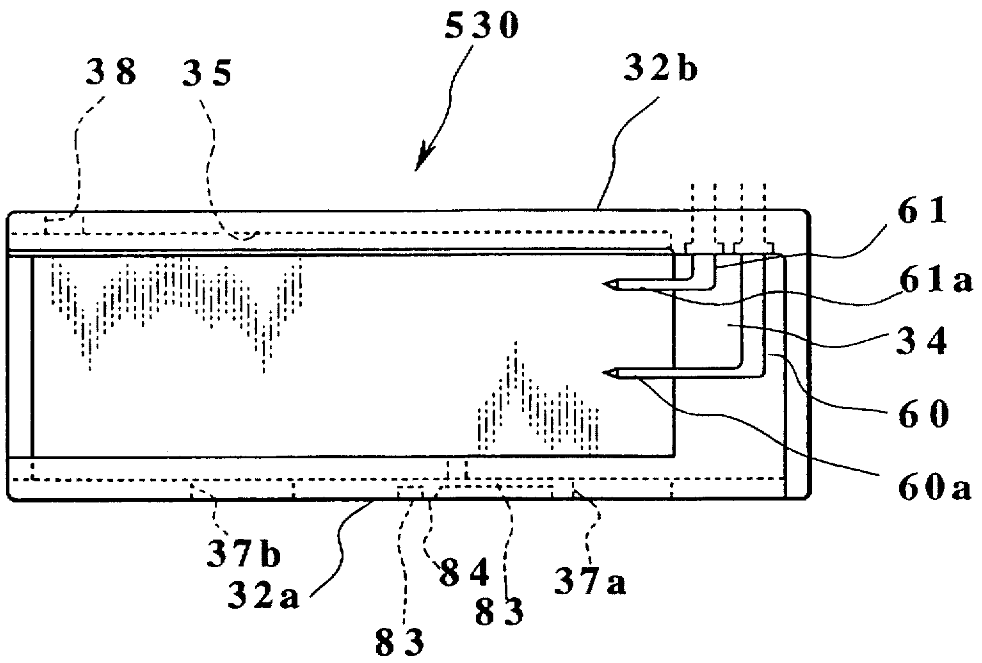
FIG. 23 is a plan view showing the housing of the female connector according to the fourth embodiment of the invention.
Figure 24:
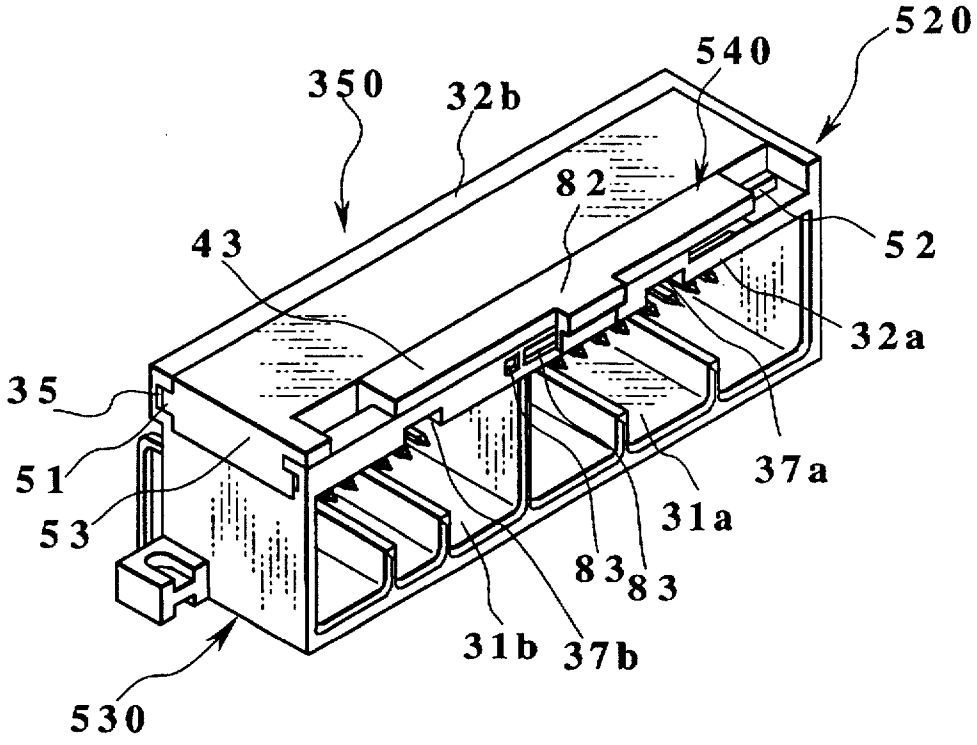
FIG. 24 is a diagram showing the external appearance of the female connector according to the fourth embodiment.
Figure 25:
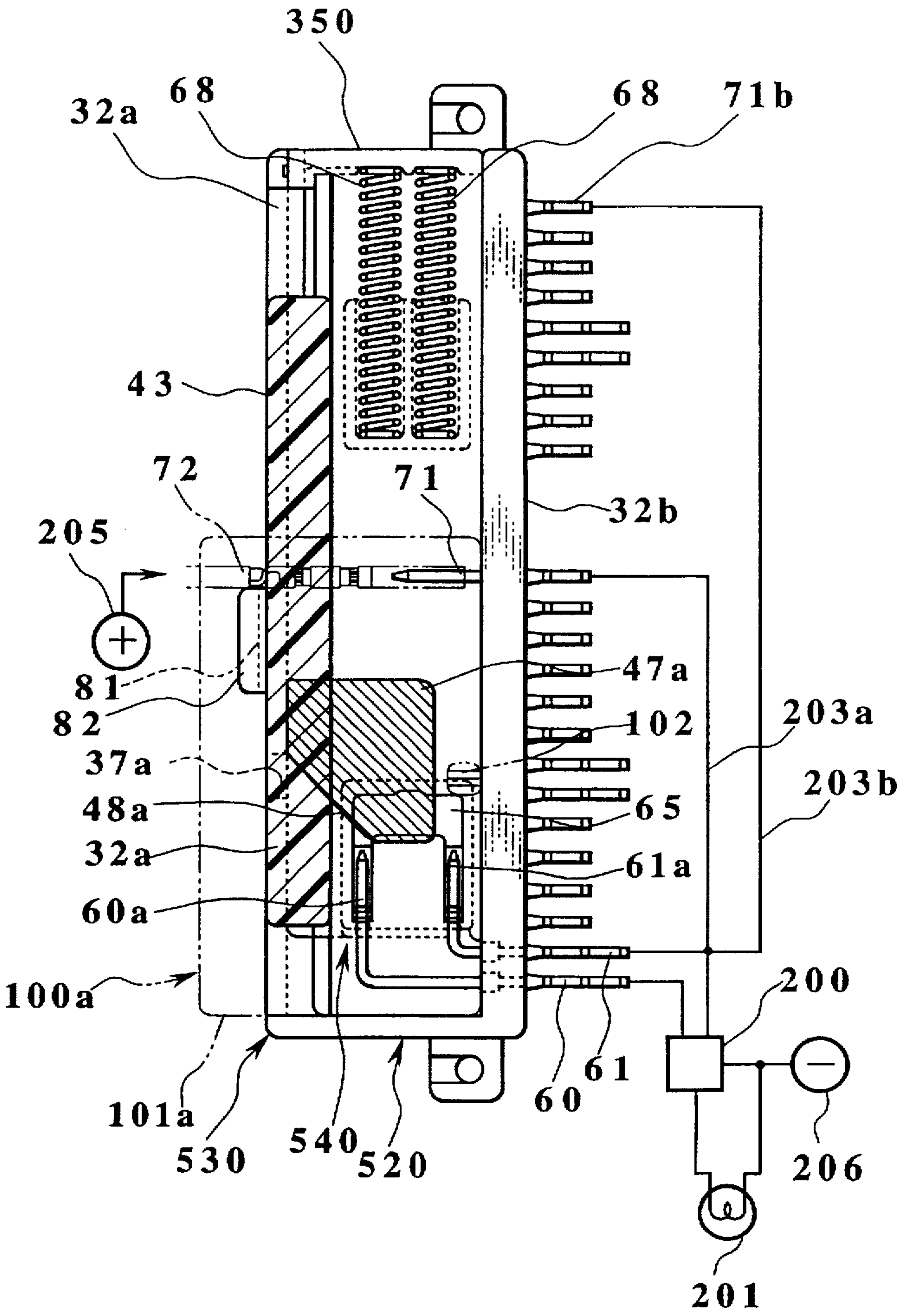
FIG. 25 is a plan view showing the relation between the component elements with the connectors completely fitted on each other according to the fourth embodiment of the invention.
Figure 26:
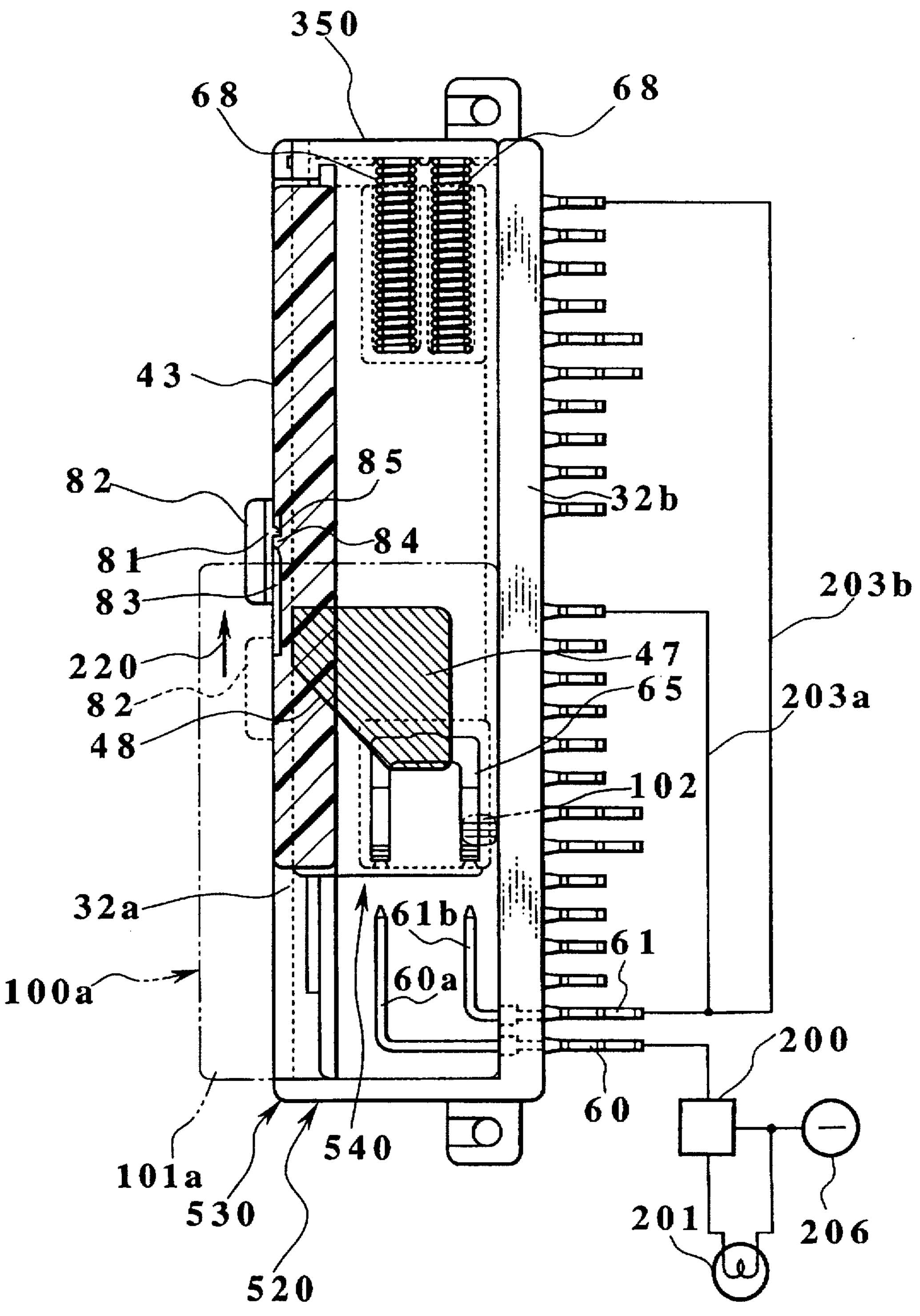
FIG. 26 is a plan view showing the relation between the component elements with the slider provisionally engaged in a relief position by operating a handle when the male connector leaves the state shown in FIG. 25.
Figure 27:
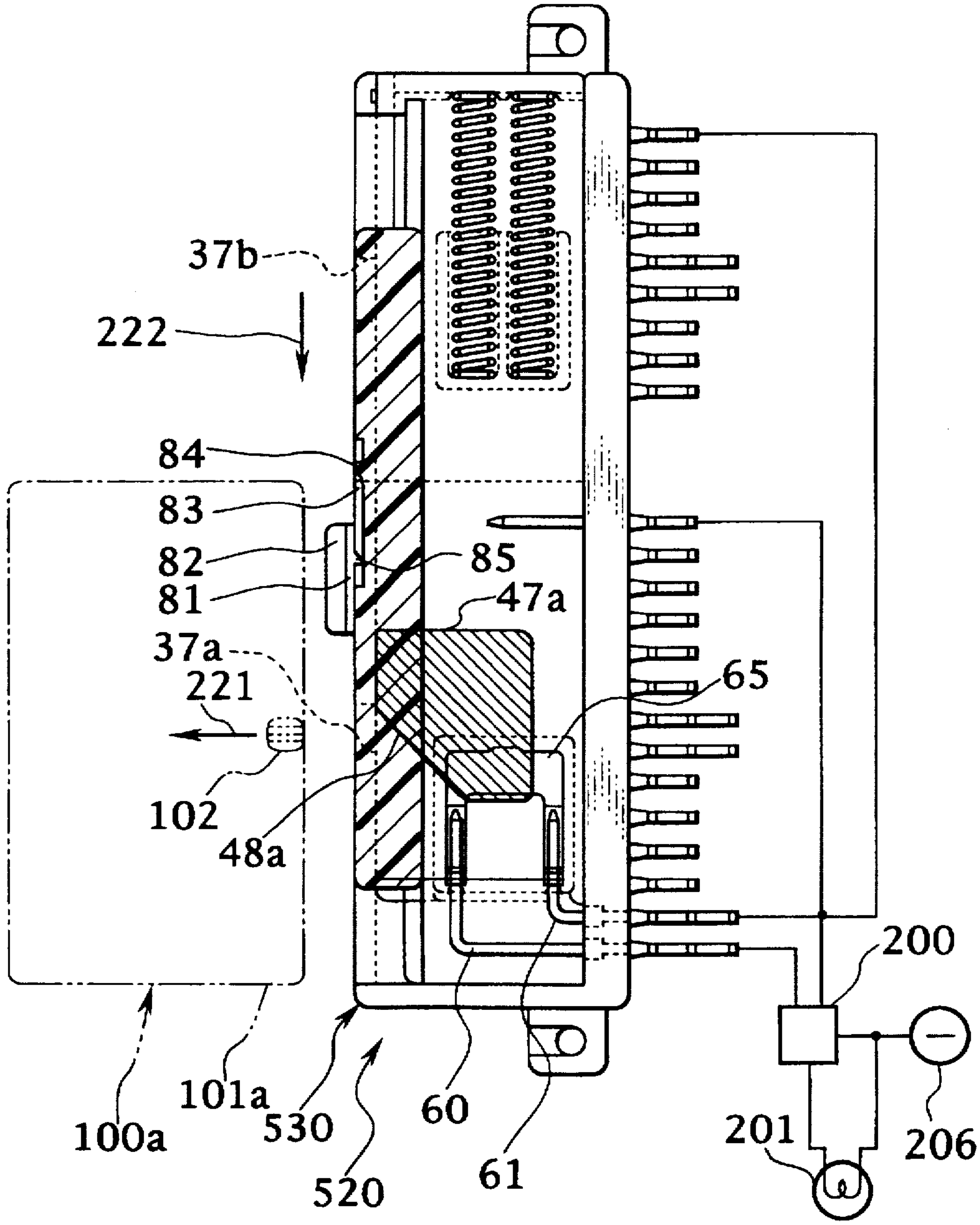
FIG. 27 is a plan view showing the male connector that has left the state shown in FIG. 26.

FIG. 22A is a diagram showing a configuration of the slider 540, FIG. 23 is a plan view showing a male connector housing 530 and FIG. 24 is a perspective view of the external appearance of the female connector in assembled state. FIGS. 25 to 27 show plan views for explaining the operation performed when the male connector 100*a* is caused to leave the female connector 520.

In the second embodiment explained with reference to FIG. 25, assume that the male connector 100*a* is caused to leave the female connector 320 (designated by numeral 520 in the present embodiment) fitted with the male connector 10*a*. The slider pressure protrusion 102 of the male connector 100*a* comes into contact with the slider drive protrusion 47*a* formed on the lower surface of the slider 340 (corresponding to the component part designated by numeral 540 according to this embodiment), and therefore the male connector 10*a* cannot be separated directly. In removing the male connector 100*a*, therefore, the slider 340 is required to be held by hand in a position moved to the opposite side against the spring 6 while the male connector 100*a* is required to removed. This procedure may be considerably difficult to perform.

In view of this, the female connector 520 according to the fourth embodiment includes a provisional engaging mechanism for provisionally engaging the slider 540 at a position capable of separating the male connector 100*a*.

Figure 1:
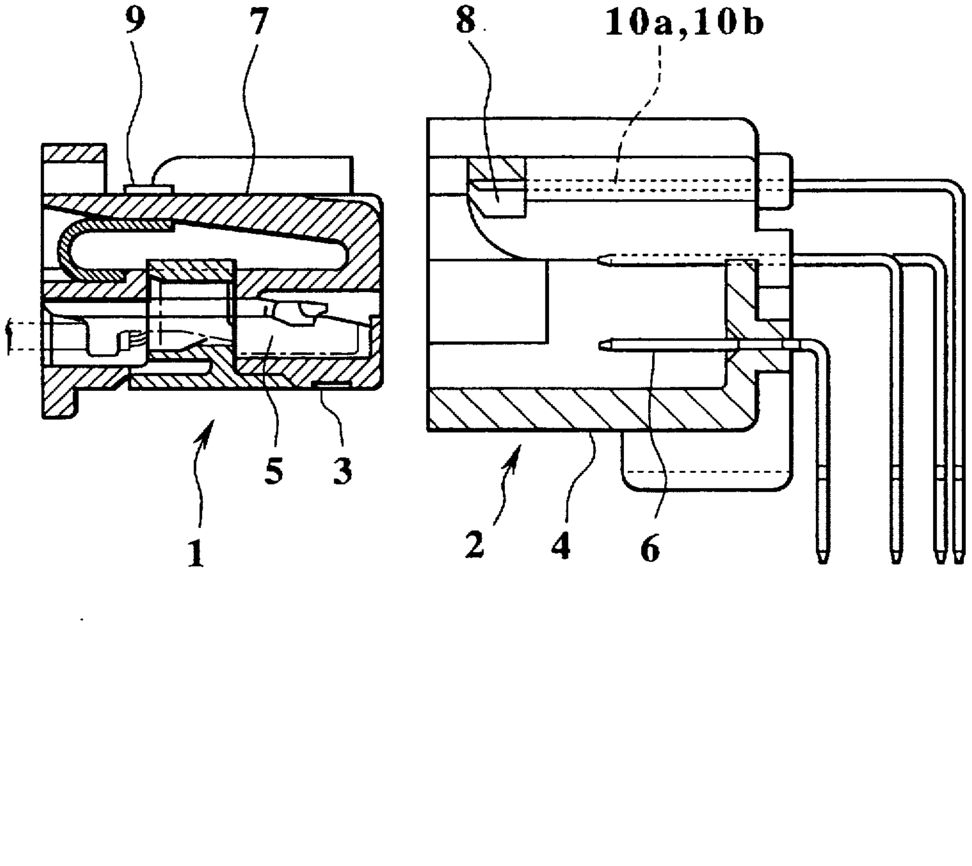
FIG.1 PRIOR ART
FIG. 1 is a sectional view showing conventional connectors not fitted with each other.
Figure 2:
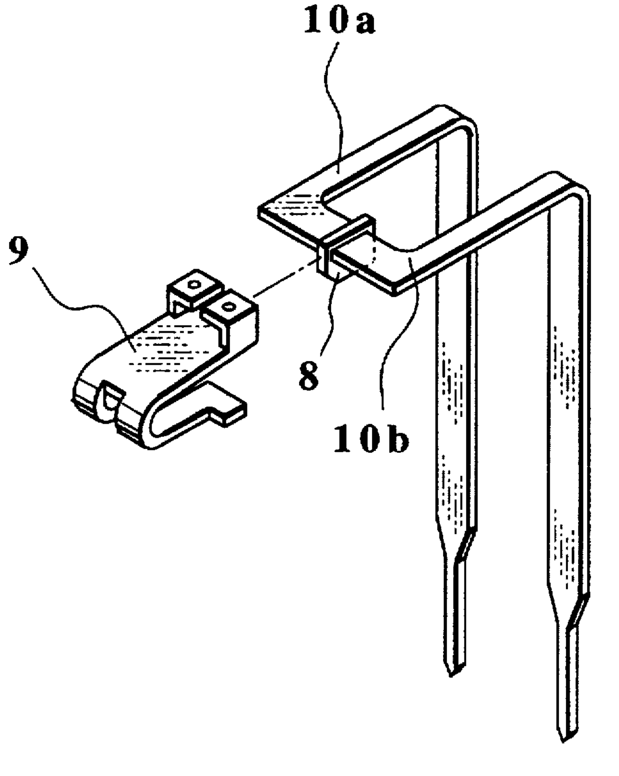
FIG. 2 is a perspective view showing the relation between the shorting electrode and the detection electrodes of the connectors of FIG. 1.
Figure 3:
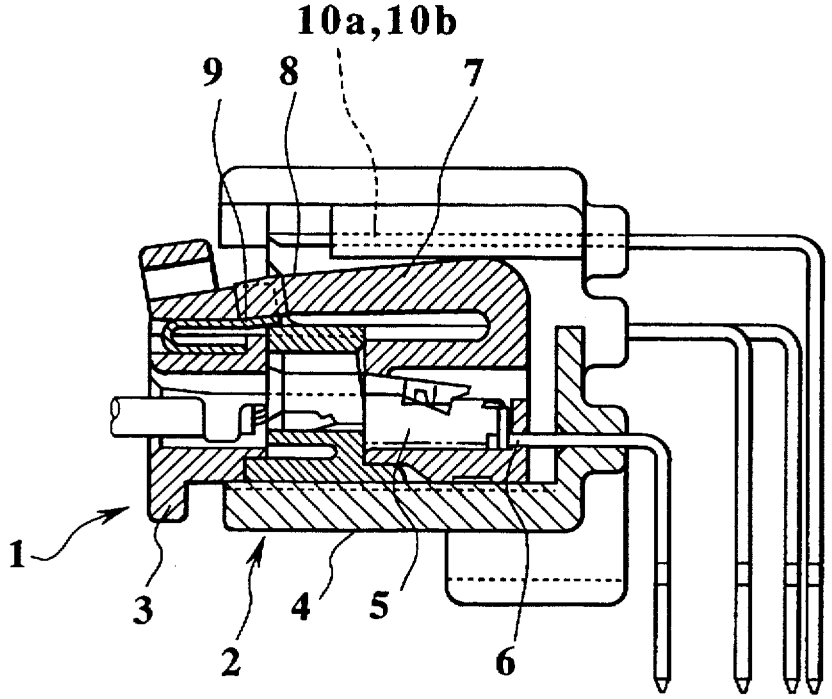
FIG.3 PRIOR ART
FIG. 3 is a sectional view showing the connectors of FIG. 1 in the process of fitting.
Figure 4:
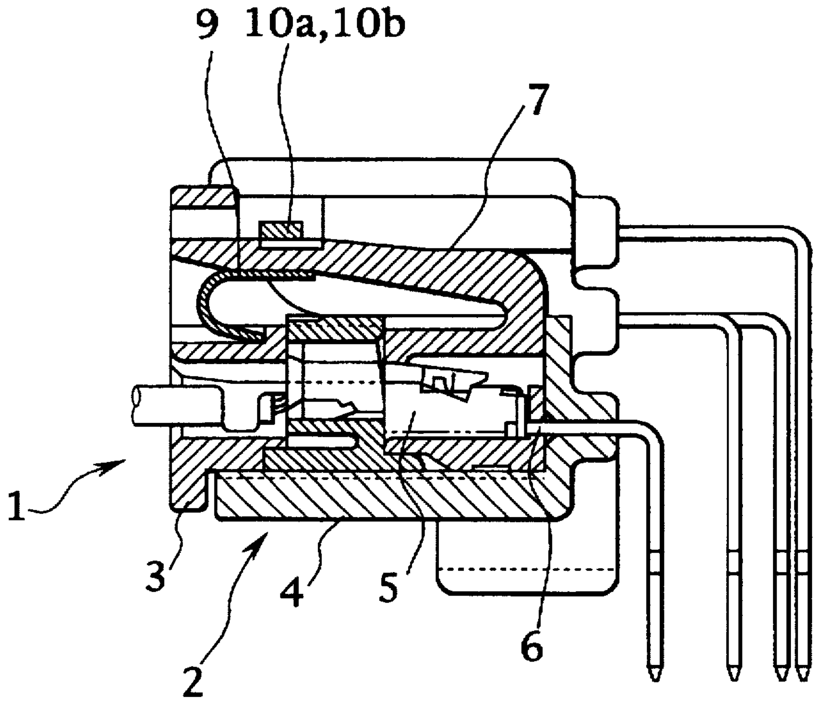
FIG.4 PRIOR ART
FIG. 4 is a sectional view showing the connectors of FIG. 1 after complete fitting.
Figure 22B:
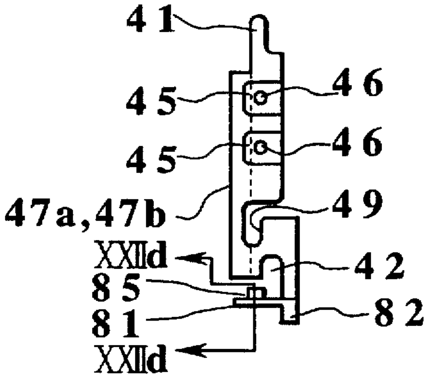
FIG. 22B is a sectional view taken in line XXIIb—XXIIb in FIG. 22A.
Figure 22C:
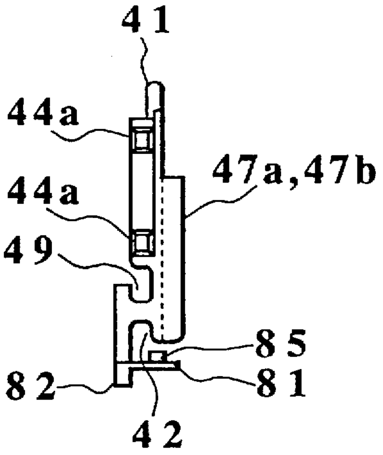
FIG. 22C is a sectional view taken in line XXIIc—XXIIc in FIG. 22A.
Figure 22D:
FIG. 22D is a sectional view taken in line XXIId—XXIId in FIG. 22B.

More specifically, as shown in FIGS. 21 and 22, the front end surface 43*a* of the exposed wall 43 of the slider 540 is formed with a flexible wall (flexible engaging portion) 81 with a handle 82 directed down, and a lock protrusion 85 formed on the internal surface of the flexible wall 81 as shown in FIGS. 22B, 22C and 22D. Also, the front end surface of the front guide wall 32*a* of the female connector housing 530 is formed with an engaging groove 83 for sliding the lock protrusion 85, and a provisional engaging protrusion 84 for engaging the lock protrusion 85 in the intermediate portion of the engaging groove 83. As shown in FIG. 1B, the right side of the provisional engaging protrusion 84 is configured of a slope 84*a*, and the left side thereof is formed of a vertical surface 84*b*. When the slider 540 is pressed to the left end by holding the handle 82, the lock protrusion 85 is adapted to engage the vertical surface 84*b* over the provisional engaging protrusion 84. Under this provisionally engaged state, the slider drive protrusions 47*a*, 47*b* formed on the lower side of the slider 540 are displaced from the route of separating the slider pressure protrusion 102 of the male connectors 100*a*, 100*b*.

The operation will be explained with reference to FIGS. 25 to 27.

As shown in FIG. 25, in the case where the male connector 100*a* is caused to leave the fitted state with the female connector 520, the slider drive protrusion 47*a* protruded from the lower side of the slider 540, in its direct form, hampers the separation. In view of this, as show in FIG. 26, the slider 540 is moved to the extreme left (the upper end in the drawing) as indicated by arrow 220 by holding the handle 82. At that position, the lock protrusion 85 formed from the inner surface of the flexible wall 81 stops over the provisional engaging protrusion 84 where the slider 540 is locked. As a consequence, the male connector 10*a* can be separated under this condition from the female connector 520 as indicated by arrow 221 in FIG. 27. After the separation, the slider 540 is returned to the original position by the handle 82 as shown by arrow 222 in the drawing. The initial state thus is restored.

In the case of the connector unit according to the fourth embodiment, the slider 540 can be provisionally engaged at a position where the male connector 100*a* can be separated. Therefore, the cumbersome operation of separation by holding the slider by hand is eliminated, thereby facilitating the work of separating the connector.

Now, the connector unit according to a fifth embodiment of the invention will be explained with reference to FIGS. 28 to 34.

The connector unit according to the fifth embodiment is partially improved from the connector unit of the fourth embodiment in such a manner that the slider which is manually returned according to the fourth embodiment can be automatically returned after separating the connector.

Figures 28A, 28B:
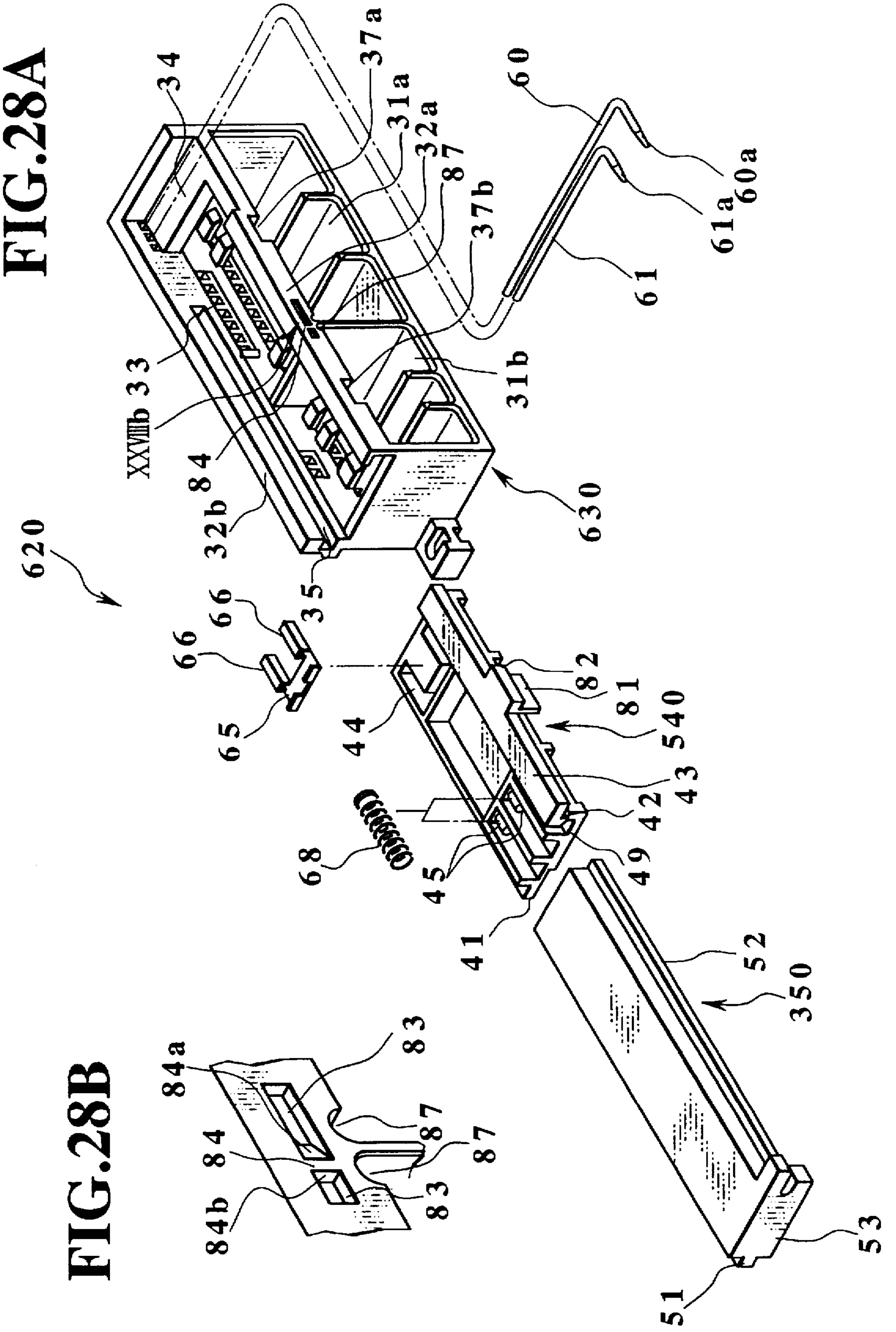
FIG. 28A is an exploded perspective view of the female connector according to a fifth embodiment of the invention.
FIG. 28B is an enlarged sectional view of the part indicated by arrow XXVIII in FIG. 28A.
Figure 29:
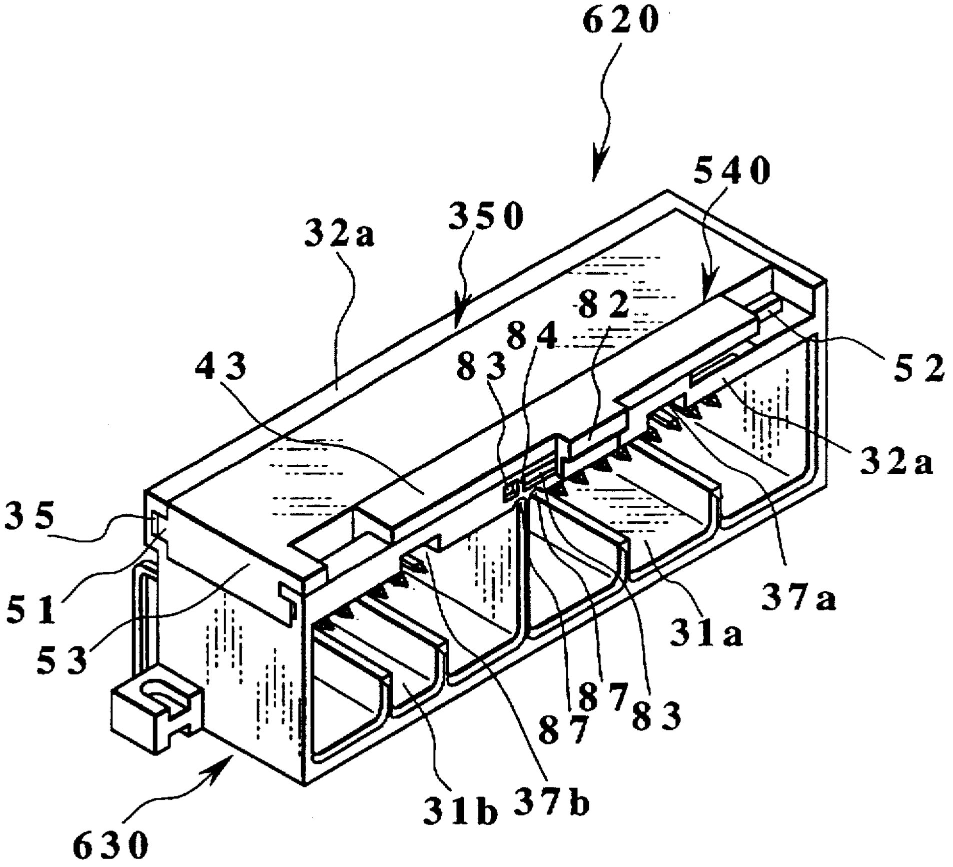
FIG. 29 is a diagram showing the external appearance of the female connector according to the fifth embodiment of the invention.
Figure 30:
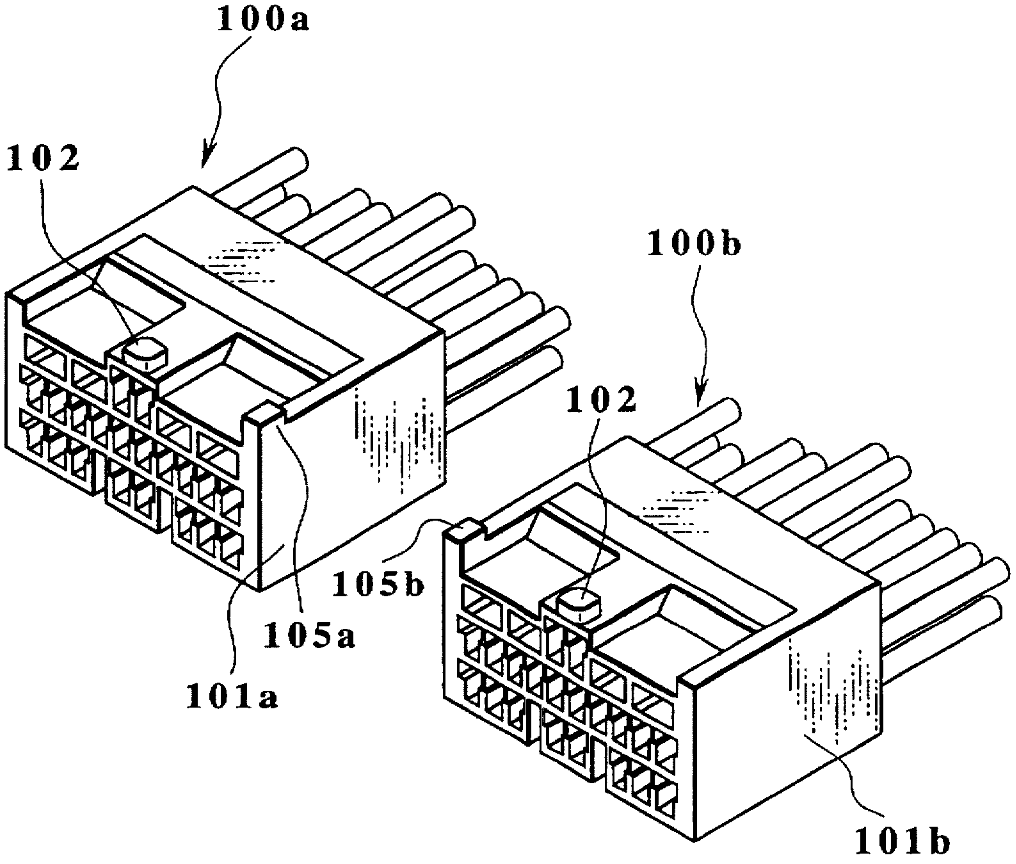
FIG. 30 is a perspective view of the female connector according to the fifth embodiment of the invention.

FIG. 28A is an exploded perspective view showing a female connector 620, FIG. 29 is an outer perspective view of the female connector 620 in assembled state, and FIG. 30 is an outer perspective view of the male connectors 100*a*, 10*b*. In the connector unit according to the fifth embodiment, as shown in FIGS. 28A and 29, passage grooves 87, 87 are formed at positions on the female connector housing 630 corresponding to the flexible wall 81 with the slider 540 moved to the provisionally engaged point. At the same time, disengaging protrusions (disengaging sections) 105*a*, 105*b* for displacing the flexible wall 81 outward of the provisionally engaged point through the passage groove 87 at the time of separation are formed on the upper surface of the left and right male connectors 100*a* and 100*b* fitted in the two-mating connector fitting portions 31*a*, 31*b*, respectively. The flexible wall 81 is located intermediate between the two mating connector fitting portions 31*a*, 31*b*, and therefore the disengaging protrusions 195*a*, 105*b* are adjacent to each other.

The operation will be explained with reference to FIGS. 31 to 34.

Figure 31:
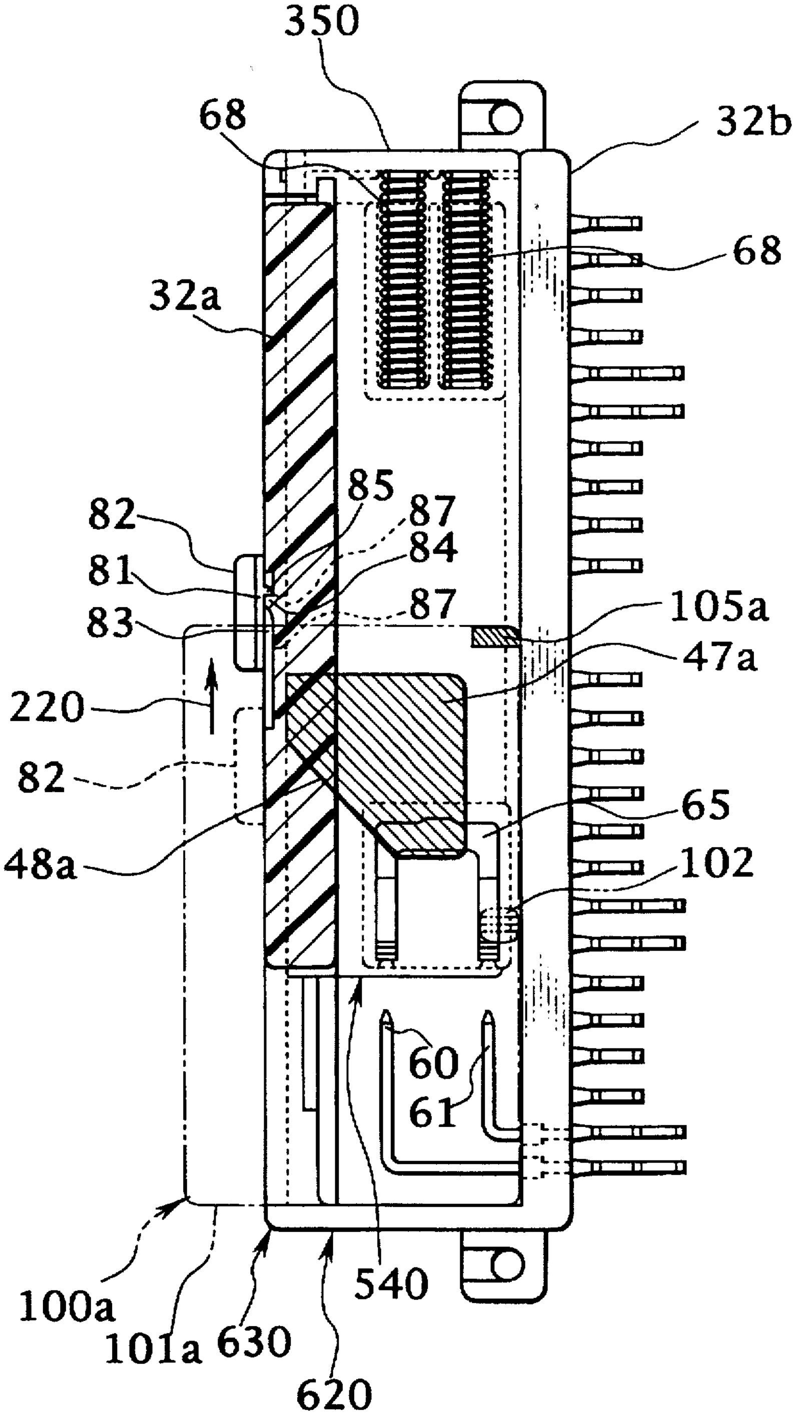
FIG. 31 is a plan view showing the relation between the component elements with the slider provisionally engaged in a relief position by operating a handle when the male connector is caused to leave the female connector from the completely fitted state according to the fifth embodiment of the invention.

As shown in FIG. 31, the slider drive protrusion 47*a* protruded from the lower surface of the slider 540 provides an interference preventing the male connector 100*a* from being separated directly from the state fitted in the female connector 620. Therefore, the slider 540 is moved along the direction of arrow 220 to the extreme left (the upper end in the drawing) by the handle 82 and provisionally engaged there, as explained above. In the process, the position of the flexible wall 81 corresponds to that of the disengaging protrusion 105*a* of the male connector 100*a*.

Figure 32:
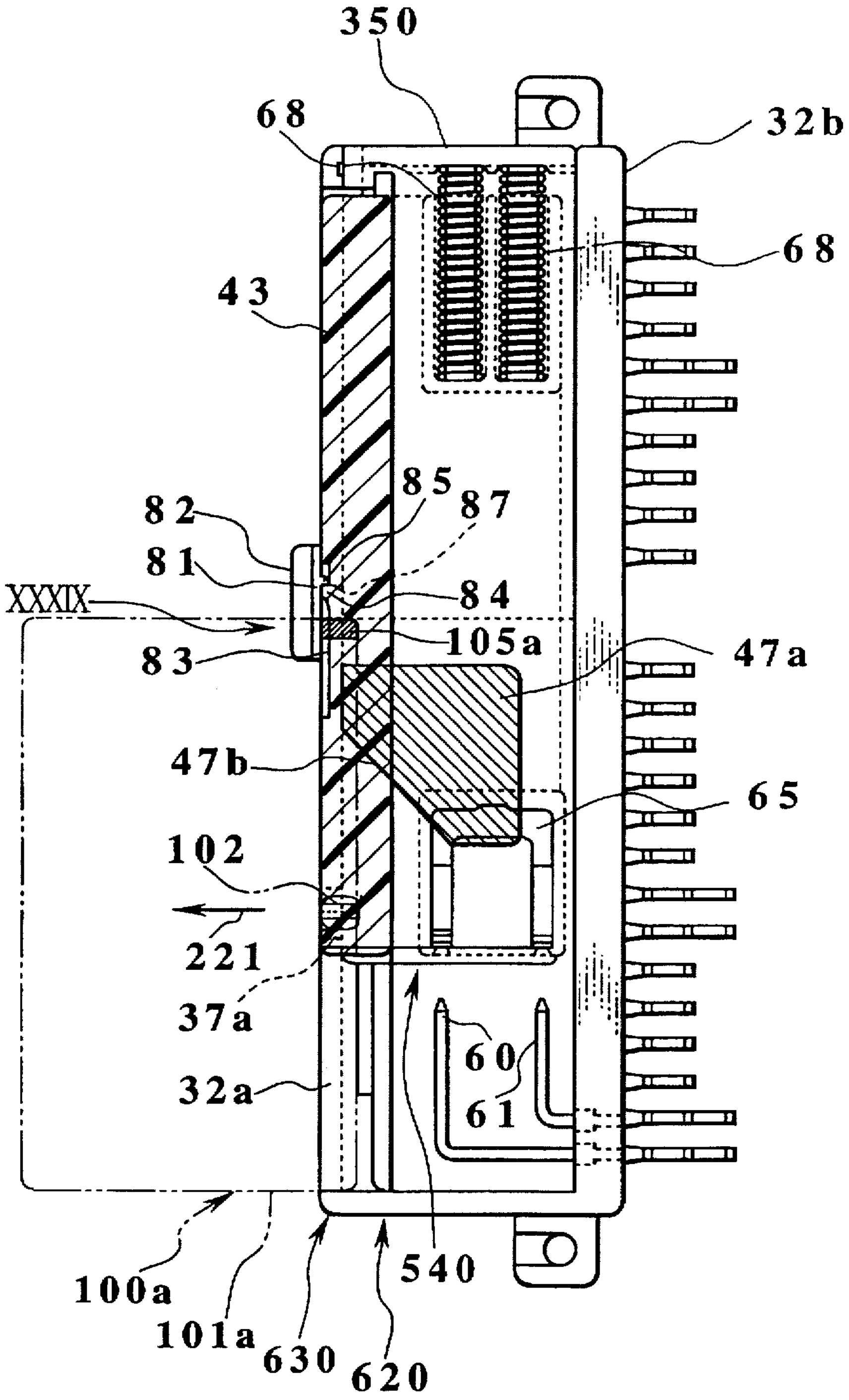
FIG. 32 is a plan view showing the male connector in the process of leaving the state shown in FIG. 31.
Figure 33:
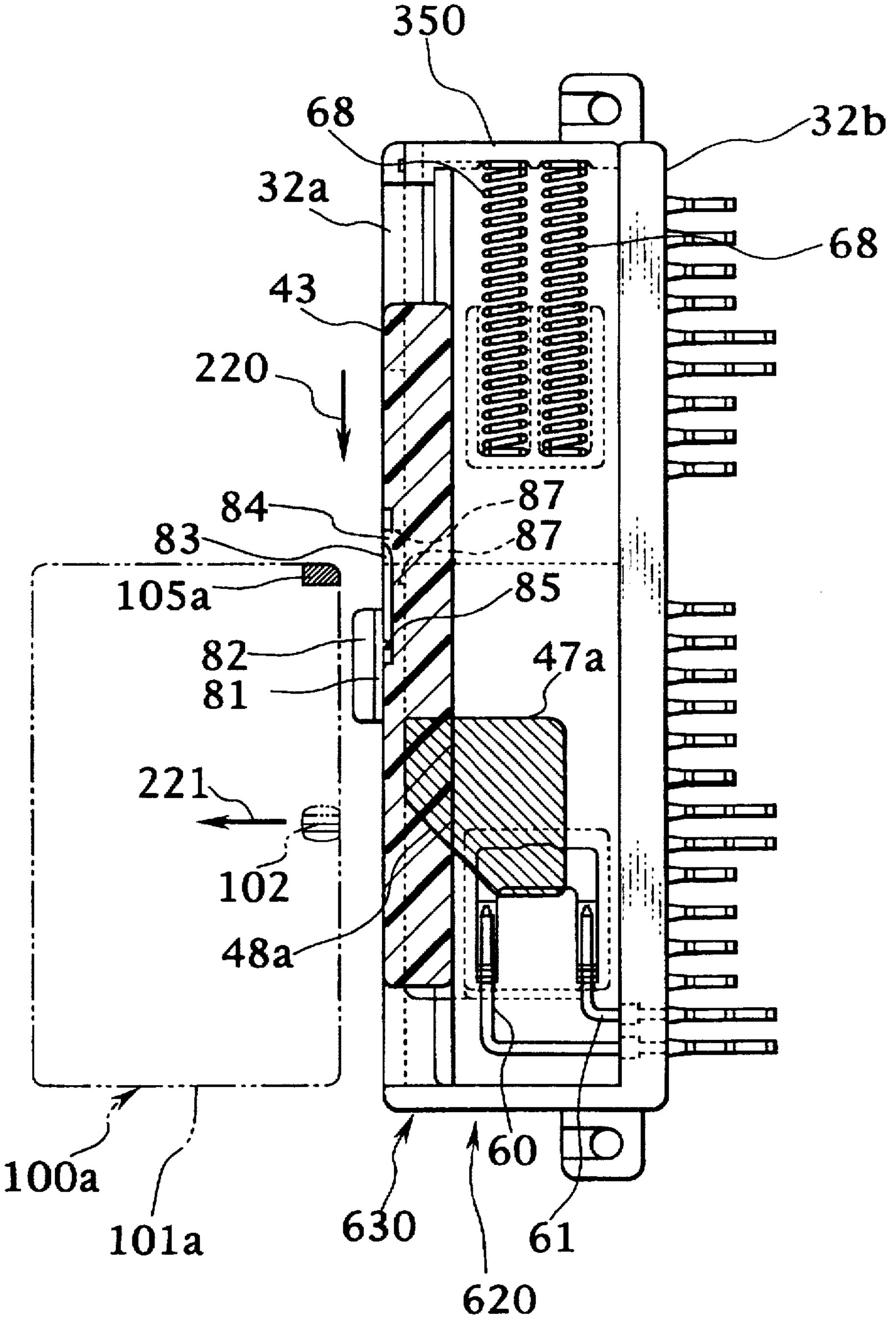
FIG. 33 is a plan view showing the male connector that has left the state shown in FIG. 32.
Figure 34A:
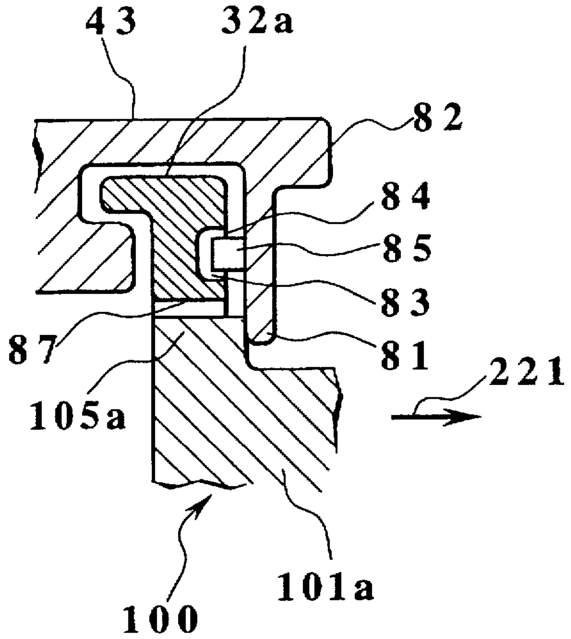
FIG. 34A is an enlarged sectional view of the part indicated by arrow XXXIV showing the state before a flexible wall is displaced with the progress of separation of the male connector.
Figure 34B:
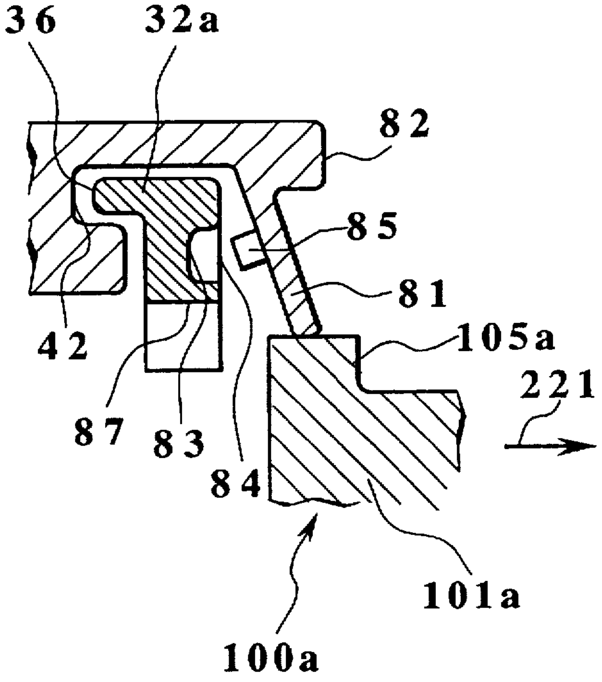
FIG. 34B is an enlarged sectional view of the part indicated by arrow XXXIV in FIG. 32 showing the slider released from the provisional engagement with the progress of separation of the male connector and the resulting displacement of the flexible wall.

As shown in FIG. 32, assume that the male connector 100*a* is pulled out of the female connector 620 in the direction of arrow 221. Then, the disengaging protrusion 105*a* of the male connector 100*a* comes into contact with the flexible wall 81 as shown in FIG. 34A. A further process of pulling off the male connector 100*a* causes the flexible wall 81 to be displaced outward by the disengaging protrusion 105*a* as shown in FIG. 34B. As a result, the lock protrusion 85 of the flexible wall 81 is disengaged from the provisional engaging protrusion 84 of the female connector housing 630. Upon complete tat separation of the male connector 100*a*, the slider 540 energized by the spring 68 is automatically returned to the original position. The operation of returning the slider 540 is thus eliminated and the operation is simplified.

What is claimed is:

1. A connector fitting detection apparatus comprising:

a first connector housing and a second connector housing adapted to fit one within the other;

a slider movable on said first connector housing and set in an original position when the first and second connector housings are not fitted with each other, said slider being movable upon fitting movement of said first and second connector housings to be displaced from said original position by a sliding force developed by said first and second connector housings fitting one within the other, means for biasing said slider to return to said original position upon complete fitting between said first and second connector housings; and a plurality of fitting detection terminals mounted on said first connector housing and said slider, said fitting detection terminals capable of coming into contact with each other when the slider is in said original position and coming out of contact with each other when said slider leaves said original position.

2. A connector fitting detection apparatus according to claim 1, further comprising:

common terminals mounted on said first and second connector housings; and decision means electrically connected to said common terminals and fitting detection terminals, said decision means capable of detecting whether the common terminals come into contact with each other and whether said fitting detection terminals are in contact or not.

3. A connector fitting detection apparatus according to claim 1, wherein:

said slider is biased to said original position by a spring;

said slider includes a slider drive protrusion having a cam inclined in the direction of fitting said second connector housing;

said second connector housing includes a slider pressure protrusion, said slider pressure protrusion capable of applying said sliding force onto said slider drive protrusion; and said slider pressure protrusion interferes with said slider drive protrusion thereby to apply a sliding pressure to said cam in such a manner as to move said slider away from said original position against the force of said spring when said second connector housing is being fitted within said first connector housing, said slider pressure protrusion adapted to pass a point of the interference with said slider drive protrusion when said second connector housing reaches a completely fitted position.

4. A connector fitting detection apparatus according to claim 3, wherein:

said first connector housing includes a plurality of juxtaposed mating connector fitting portions; and said slider is formed in a size extending over a plurality of said mating connector fitting portions and movably along the direction of arrangement of said mating connector fitting portions; and said slider includes as many slider drive protrusions as said mating connector fitting portions.

5. A connector fitting detection apparatus according to claim 1, wherein:

said fitting detection terminals include a pair of detection electrodes arranged on said first connector housing and a shorting electrode arranged on said slider for coming into contact with said two detection electrodes thereby to short said two detection electrodes when said slider is in said original position.

6. A connector fitting detection apparatus according to claim 5, wherein:

said detection electrodes and said shorting electrode include a male terminal and a female terminal, respectively, adapted to fit each other when in contact with each other.

7. A connector fitting detection apparatus according to claim 5, wherein:

said detection electrodes and said shorting electrode each include a contact surface adapted to come into contact with each other.

8. A connector fitting detection apparatus according to claim 3, further comprising:

a flexible engaging section for provisionally engaging said slider at a position where said slider drive protrusion is displaced from the passage of said slider pressure protrusion when said second connector housing is separated from said first connector housing.

9. A connector fitting detection apparatus according to claim 8, wherein:

said second connector housing includes a provisional disengaging portion adapted to come into contact with the flexible engaging section provisionally engaging said slider in the process of separation of said connector housings thereby to release said flexible engaging section from the provisional engagement.

* * * * *